(12) United States Patent
Hanzawa et al.

(10) Patent No.: US 7,057,912 B2
(45) Date of Patent: Jun. 6, 2006

(54) SEMICONDUCTOR DEVICE

(75) Inventors: Satoru Hanzawa, Hachioji (JP); Takeshi Sakata, Hino (JP); Riichiro Takemura, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 179 days.

(21) Appl. No.: 10/755,333

(22) Filed: Jan. 13, 2004

(65) Prior Publication Data

US 2004/0240277 A1 Dec. 2, 2004

(30) Foreign Application Priority Data

May 28, 2003 (JP) ............................. 2003-150246

(51) Int. Cl.
*G11C 15/00* (2006.01)
(52) U.S. Cl. .................. 365/49; 365/222; 365/189.07; 711/108
(58) Field of Classification Search ..................... None
See application file for complete search history.

(56) References Cited

U.S. PATENT DOCUMENTS 6,563,754 B1 * 5/2003 Lien et al. .................. 365/222
6,576,943 B1    6/2003 Ishii et al.

FOREIGN PATENT DOCUMENTS

| JP | 10-27481 | 7/1996 |
|---|---|---|
| JP | 2000-269457 | 3/1999 |
| JP | 2002-197872 | 12/2001 |

OTHER PUBLICATIONS

Valerie Lines et al., "66 MHz 2.3M Ternary Dynamic Content Addressable Memory", Records of the 2000 IEEE Workshop on Memory Technology, Design and Testing, pp. 101-105.

* cited by examiner

*Primary Examiner*—David Lam
(74) *Attorney, Agent, or Firm*—Reed Smith LLP; Stanley P. Fisher, Esq.; Juan Carlos A. Marquez, Esq.

(57) ABSTRACT

A T-CAM array is provided made up of ternary dynamic CAM cells each including a plurality of transistors. A refresh operation can be performed while reading out stored data to a match line using the same current path as that for a search operation, thereby providing a highly integrated array without reducing the original search speed. A rewrite data line is provided in parallel with a match line, and rewrite transistors are inserted between the rewrite data line and the storage nodes within each dynamic CAM cell. With this cell configuration, the data stored at each storage node is read out to the match line one at a time and rewritten through the rewrite data line to carry out a refresh operation.

15 Claims, 26 Drawing Sheets

FIG.7

| SEARCH KEY | | | ENTRY | | | STATE OF CURRENT PATH | | RESULT |
|---|---|---|---|---|---|---|---|---|
| DATA | SL2 | SL1 | DATA | N1 | N2 | M1 SIDE | M2 SIDE | |
| '0' | 1 | 0 | '1' | 1 | 0 | CONDUCTIVE | CUT OFF | MISS |
| '1' | 0 | 1 | '1' | 1 | 0 | CUT OFF | CUT OFF | HIT |
| '0' | 1 | 0 | '0' | 0 | 1 | CUT OFF | CUT OFF | HIT |
| '1' | 0 | 1 | '0' | 0 | 1 | CUT OFF | CONDUCTIVE | MISS |
| '0' | 1 | 0 | 'X' | 0 | 0 | CUT OFF | CUT OFF | HIT |
| '1' | 0 | 1 | '1' | 1 | 0 | CUT OFF | CUT OFF | HIT |
| MASK | 0 | 0 | '0' | 0 | 1 | CUT OFF | CUT OFF | HIT |
| MASK | 0 | 0 | '1' | 1 | 0 | CUT OFF | CUT OFF | HIT |
| MASK | 0 | 0 | 'X' | 0 | 0 | CUT OFF | CUT OFF | HIT |

(The SPlayer is omitted.)

FRM(BL2)  FRM(BL1)

SEMICONDUCTOR DEVICE

BACKGROUND OF THE INVENTION

1. Field of the Invention

The present invention relates to a semiconductor device, and more particularly to a semiconductor device including content addressable memory cells (CAM cells) which compare data stored at their storage nodes with entered data. The present invention even more particularly relates to a semiconductor device including a highly integrated high-speed T-DCAM array made up of ternary dynamic CAM cells (T-DCAM cells) which store ternary data while refreshing it.

2. Description of the Related Art

The explosive growth of the Internet has increased the size of the tables required for network routers and switches, making it necessary to increase the table search speed. Conventionally, the calculation algorithm has been improved to speed up the table search. Such a method for enhancing the processing power, however, is approaching its limit. Furthermore, there is the problem of software solutions lacking in flexibility for supporting various network standards. Accordingly, the ternary content addressable memory (T-CAM) is attracting attention as a hardware solution for solving these problems.

A T-DCAM cell configuration of a ternary dynamic content addressable memory (T-DCAM) is described in Records of the 2000 IEEE International Workshop on Memory Technology, Design and Testing, pp. 101–105, 2000. FIG. 2 is a diagram of this cell configuration taken from FIG. 2 of the above document. This cell has storage nodes N1 and N2 made up of NMOS transistors T1, T2, T4, and T6 and capacitors C1 and C2 and stores ternary data.

The cell has an XNOR operation function implemented by the NMOS transistors T3, T4, T5, and T6 to compare its stored data with entered data.

First of all, its memory function will be described.

The ternary data uses three distinct values: data 1, data 0, and data X, which indicates the so-called DON'T CARE state. Assuming that a high voltage level represents a logic "1" and a low voltage level represents a logic "0", the combination of the logic values of the storage nodes N1 and N2 corresponding to data 1 is "1" and "0" expressed as (1, 0); that corresponding to data 0 is "0" and "1", or (0, 1); and that corresponding to data X is "0" and "0", or (0, 0). The stored data is refreshed through the transistors T1 and T2, and read out and rewritten by use of sense amplifiers (not shown in the figure) connected to bit lines BL1 and BL2.

The XNOR operation function will be described below. The data to be compared with the stored data is ternary data and is entered through search lines SL1 and SL2. This ternary data uses three values: data 1, data 0, and data MASK, which indicates the so-called MASK state. In the comparison operation, if the entered data coincides with the stored data, since no current path is formed between a match line ML currently precharged at a high voltage and a discharge line DCL set at a low voltage (for example, ground potential VSS), the match line remains at the precharge voltage (the high voltage). If, on the other hand, they do not coincide, the match line is discharged since a current path is formed between the match line ML and the discharge line DCL.

A match line sense amplifier (not shown) senses changes in the voltage of the match line in the above operation to produce a comparison result. It should be noted that if the stored data is data X, or the entered data is data MASK, it is determined that the entered data coincides with the stored data since no current path is formed between the match line ML and the discharge line DCL.

Another T-DCAM cell configuration is described in Japanese Laid-Open Patent Publication 2002-197872. FIG. 3 is a diagram of this cell configuration taken from FIG. 2 of the above patent publication. This cell has an XNOR operation function implemented by the transistors T3, T4, T5, and T6, as does the cell described in Records of the 2000 IEEE International Workshop on Memory Technology, but the component configurations for their memory functions are different. Specifically, two NMOS transistors T9 and T10 are newly added to the configuration shown in FIG. 2. The cell shown in FIG. 3 having such a configuration stores ternary data, as does the cell shown in FIG. 2. The rewrite operation is carried out through the transistors T1 and T2, as in the cell having the configuration shown in FIG. 2. In the refresh operation, however, the present cell performs read operation in a different way, that is, by use of the newly added transistors T9 and T10. Specifically, when the transistors T9 and T10 are activated, signals corresponding to the conductive states of the transistors T4 and T6 determined by the stored data are generated on the bit lines BL1 and BL2.

Prior to the filing of this application, the present inventors studied how to increase the speed and the integration density of the T-CAM array and found that, of all prior art T-DCAM cells having a small cell area, the type of cell shown in FIG. 3 is important since it has the following two advantages.

One is that theoretically this cell can operate without capacitors, eliminating (or alleviating) the need for forming capacitors, which is an obstacle to miniaturization.

The other is that if this cell is formed of only NMOS transistors without using capacitors, the number of masks to be employed is reduced, which is expected to lead to reduced cost per bit.

The present inventors, however, have found that this cell has the following three problems.

The first problem is its reduced XNOR operation speed. As described above, the cell configuration shown in FIG. 3 is obtained by adding the transistors T9 and T10 to the configuration shown in FIG. 2. Such a configuration might increase the diffusion capacitances at intermediate nodes M1 and M1, delaying the output signal to the match line ML. Increased XNOR operation time is detrimental to speeding-up of the operation of the T-CAM array.

The second problem is the increased sense amplifier area. As described above, a T-DCAM array using the cell shown in FIG. 3 must sense (discriminate) not only the signal generated on the match line ML in the search operation but also the read signals generated on the bit lines BL1 and BL2 in the refresh operation. Therefore, sense amplifiers must be provided for all match lines and bit lines, reducing the cell occupancy ratio, which is detrimental to enhancement of the integration density of the T-CAM array.

The third problem is the deteriorated retention characteristic. Reducing the size of a transistor increases its leakage current, as is generally known. In the cell configuration shown in FIG. 3, an increase in the leakage currents of the transistors T1 and T2 leads to a reduction in the stored data retention time (or simply the retention time), requiring frequent refresh operation, which results in increased refresh power consumption of the T-CAM array.

SUMMARY OF THE INVENTION

An object of the present invention is to provide a T-DCAM cell configuration for a highly integrated high-speed T-CAM array.

A typical arrangement of the present invention will be described as follows.

A rewrite data line RWD is provided in parallel with the match line ML, and transistors for rewrite operation are inserted between the rewrite data line and the storage nodes within the T-DCAM cell. The refresh operation includes the steps of: sequentially reading the data stored at each storage node and outputting it to the match line; discriminating (detecting) the read data by use of the sense amplifier connected to the match line; transferring the read data to the rewrite data line; and writing (rewriting) the data to the storage nodes through the rewrite transistors.

With this arrangement, the search operation and the read operation are carried out using the same current path formed between the match line and the grounded electrode, making it possible to perform refresh operation while maintaining the high speed of the search operation. Furthermore, since sense amplifiers are provided for only the match lines, the T-CAM array area can be reduced.

BRIEF DESCRIPTION OF DRAWINGS

FIG. 7 is a diagram showing truth values for the search operation of the ternary dynamic CAM cell shown in FIG. 1.

DETAILED DESCRIPTION OF THE PREFERRED EMBODIMENTS

Preferred embodiments of the present invention will be described below with reference to the accompanying drawings.

Each circuit element constituting each block of the following preferred embodiments is not limited to any particular type. However, typically they are formed on, for example, a single monocrystalline silicon semiconductor substrate by use of a known semiconductor integrated circuit technique such as a CMOS (complementary MOS transistor) technique.

First Embodiment

<<T-DCAM Cell Configuration Example>>

Figure 1:
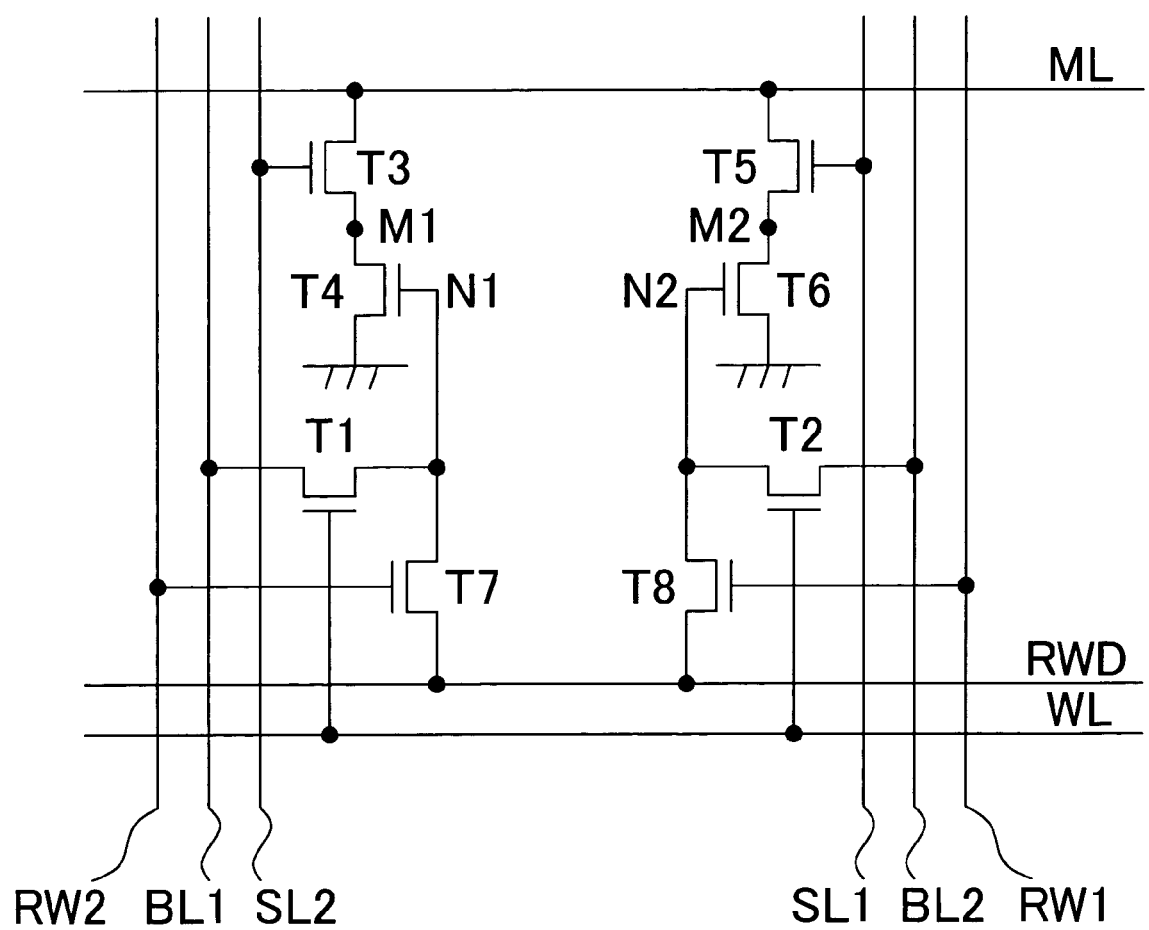
FIG. 1 is a diagram showing a configuration example of a ternary dynamic CAM cell made up of 8 transistors according to the present invention.
Figure 2:
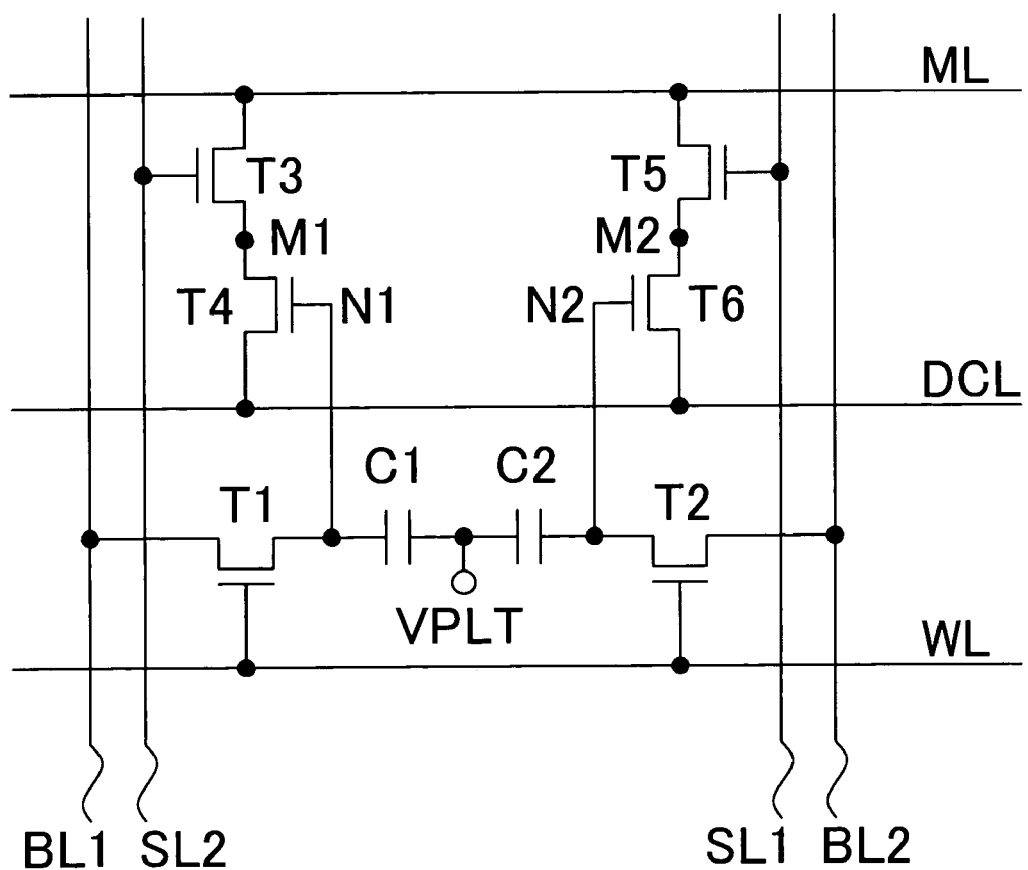
FIG. 2 is a diagram showing a configuration example of a prior art ternary dynamic CAM cell made up of 6 transistors and 2 capacitors.
Figure 3:
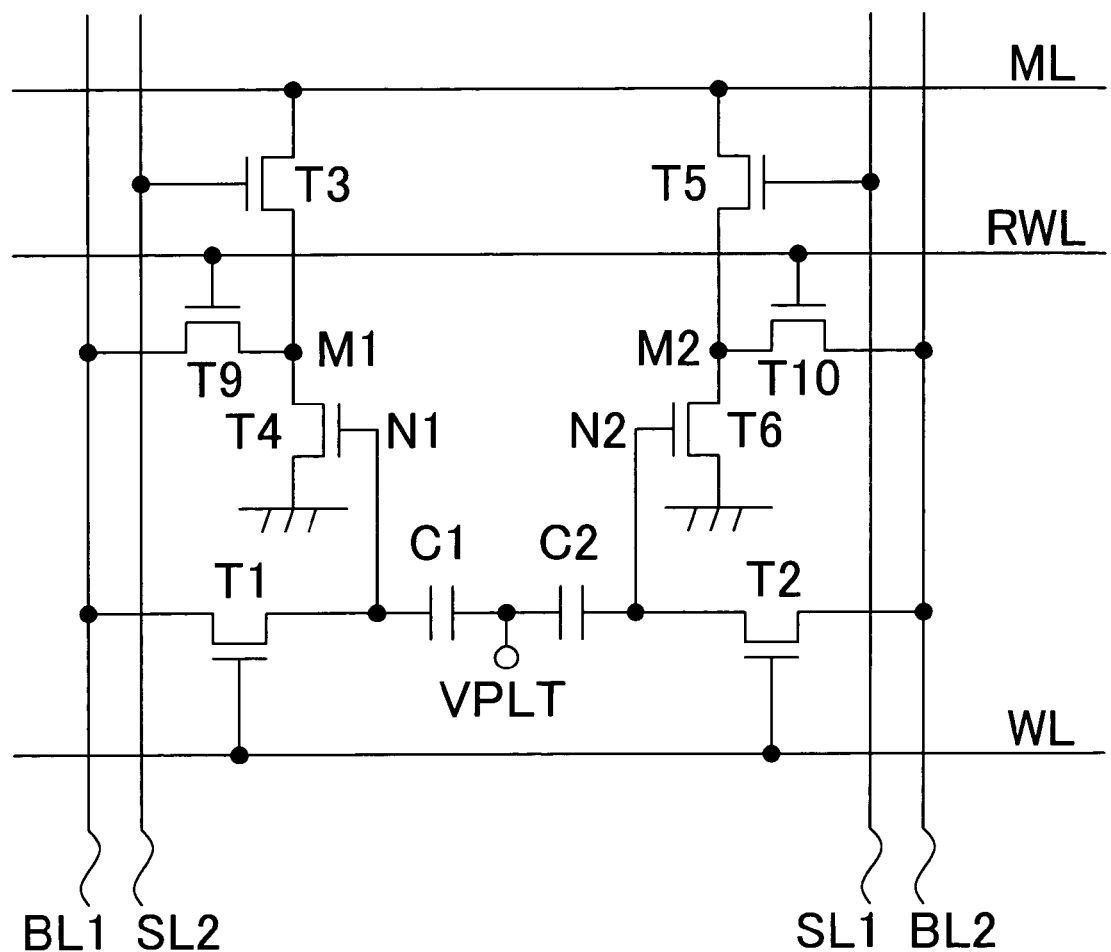
FIG. 3 is a diagram showing a configuration example of a prior art ternary dynamic CAM cell made up of 8 transistors and 2 capacitors.

FIG. 1 shows a configuration example of a T-DCAM cell according to a first embodiment of the present invention. This cell includes 8 NMOS transistors. The transistors and nodes in the figure which correspond to those in FIG. 2 or 3 are denoted by like numerals to simplify the explanation. Specifically, these common transistors are the transistors T1, T2, T3, T4, T5, and T6. The T-DCAM cell configuration of the first embodiment has the following two characteristics.

One is that the capacitors C1 and C2 employed in the cells shown in FIGS. 2 and 3 are omitted, and the storage nodes N1 and N2 are formed of parasitic capacitances instead.

The other characteristic is that a rewrite data line RWD is provided in parallel with the match line ML, and rewrite transistors T7 and T8 are inserted between the rewrite data line RWD and the storage nodes N1 and N2. The cell configuration will be described by focusing on the additional transistors T7 and T8.

The source of the transistor T7 is connected to the gate of the transistor T4 together with the source of the transistor T1 so that the diffusion capacitance (not shown) and the gate capacitance of the transistor T4 together form the storage node N1. Likewise, the source of the transistor T8 is connected to the gate of the transistor T6 together with the source of the transistor T2 so that the diffusion capacitance (not shown) and the gate capacitance of the transistor T6 together form the storage node N2. Further, the gate of the transistor T7 is connected to a rewrite column select line RW2, while the gate of the transistor T8 is connected to a rewrite column select line RW1. Still further, the drains of the transistors T7 and T8 are connected to the rewrite data line RWD.

Figure 4:
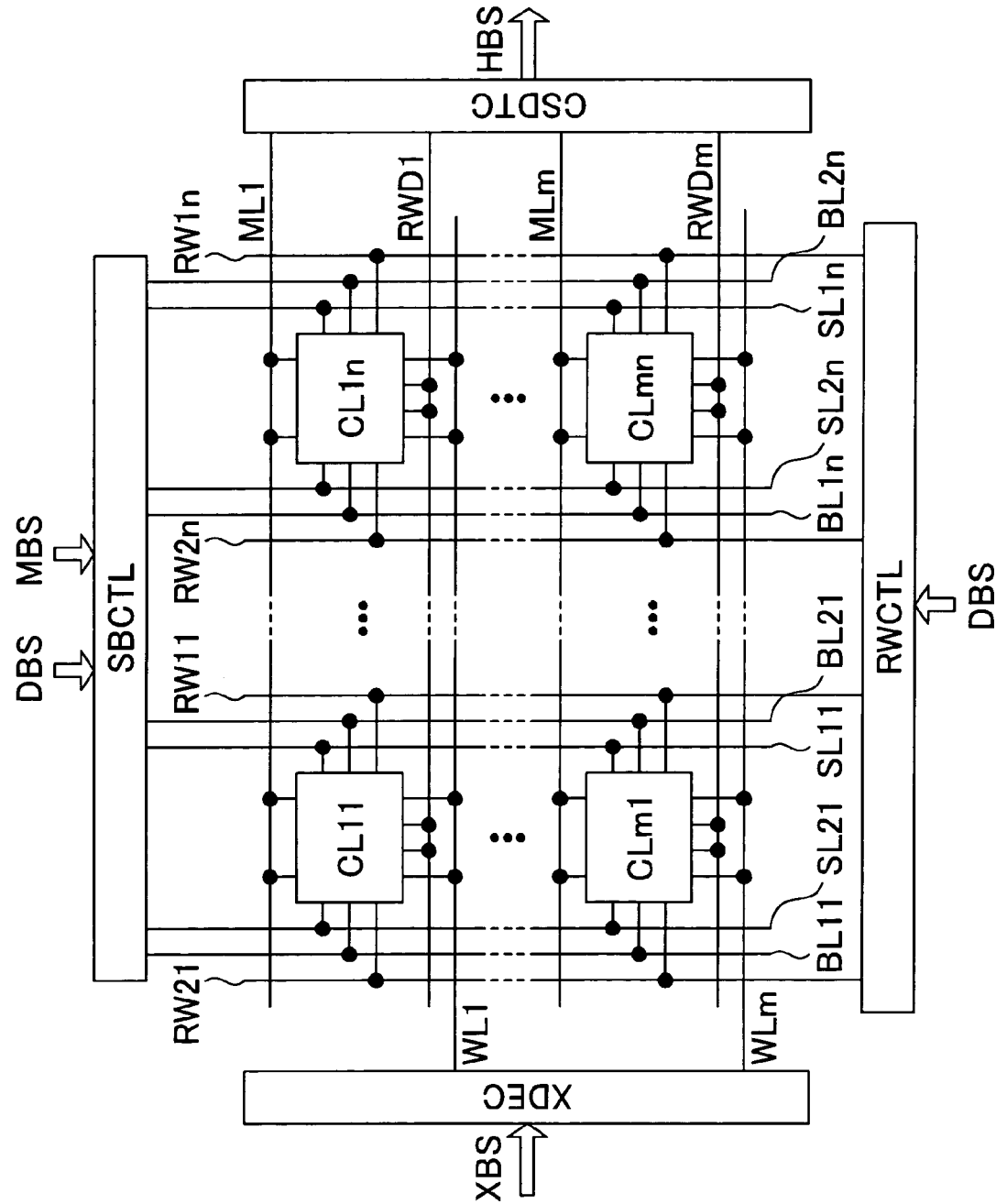
FIG. 4 is a diagram showing a configuration example of a ternary CAM array made up of ternary dynamic CAM cells such as that shown in FIG. 1.

With reference to FIG. 4, description will be made below of the configuration of a T-CAM array using T-DCAM cells having the configuration shown in FIG. 1.

The configuration shown in FIG. 4 includes m*n T-DCAM cells (CL11 to CLmn). A row decoder XDEC selects a word line from among a plurality of word lines WLj (j=1, 2, . . . , m) according to a plurality of row address signals entered through a row address bus XBS (described later). A compare signal detector CSDTC precharges match lines MLj (j=1, 2, . . . , m) and discriminates (detects) the small signals generated on the match lines MLj. The compare signal detector CSDTC also generates signals based on the small signal detection results and outputs them to a hit signal bus HBS (described later) and write data lines RWDj (j=1, 2, . . . , m). Specifically, the compare signal detector CSDTC for performing these operations may be configured such that it includes, for each match line, a precharge circuit, a sense amplifier, and a rewrite data line drive circuit. A search/bit line controller SBCTL drives search lines SLk (k=1, 2, . . . , n) and bit lines BLk (k=1, 2, . . . , n) according to an entry, a search key, and a column address entered through a data bus DBS, and a plurality of mask signals entered through a mask signal bus MKBS. Further, a rewrite column select circuit RWS drives a rewrite column select line RW corresponding to the column address entered through the data bus DBS. It should be noted that the term "entry" here refers data stored in a T-DCAM cell. Entries are input to cells through bit lines. Further, the term "search key" here refers to data that is compared with an entry. Search keys are input to the T-CAM array through search lines. In this array configuration, each cell having the configuration shown in FIG. 1 performs write and search operations on ternary data, as does the conventional cell. Furthermore, the T-CAM array activates the search lines one at a time to read stored data for each column in order to perform refresh operation, as described later. For simplicity, it is assumed that the row decoder XDEC, the compare signal detector CSDTC, the search/bit line controller SBCTL, and the rewrite column select circuit RWS are directly connected to the configuration shown in FIG. 1.

First of all, to read out the data stored at the storage node N1, the search line SL2 is activated with the search line SL1 held in an unactivated state such that conduction occurs between the match line ML and the intermediate node M1. At that time, if the transistor T4 is on, a current path is formed between the match line ML and the grounded electrode. If, on the other hand, the transistor T4 is off, no current path is formed between the match line ML and the grounded electrode. That is, whether a current path is formed between the match line ML and the grounded electrode depends on the data stored in the T-DCAM cell, and a read signal corresponding to the stored data is generated on the match line ML. Then, the above compare signal detector discriminates this signal, generates a signal corresponding to the stored data, and transfers it to the rewrite data line RWD. Lastly, the rewrite column select line RW2 is activated to write (rewrite) the stored data to the storage node N1 through the rewrite transistor T9.

This completes a refresh operation on the data stored at the storage node N1. As is easily understood from the above description, the search line SL1 and the rewrite column select line RW1 are activated to refresh the data stored at the storage node N2.

With the above basic operations in mind, detailed description will be made below of the operation of a T-DCAM cell having the configuration shown in FIG. 1.

<<Description of Write Operation>>

In the following description of the operation, reference numeral VSS denotes the ground potential, and VDD denotes the power supply voltage. Further, reference numeral VPCH denotes the precharge voltage for the match line, and VPP denotes each boosted dc voltage supplied to the word line WL and the rewrite control lines RW1 and RW2. It is assumed that the precharge voltage VPCH is set higher than the ground potential VSS but equal to or lower than the power supply voltage VDD. It is further assumed that the boosted dc voltage VPP is higher than the power supply voltage VDD, and their difference is set larger than the threshold values of the NMOS transistors. The write operation will be described with reference to FIG. 5 based on the above assumptions.

Figure 5:
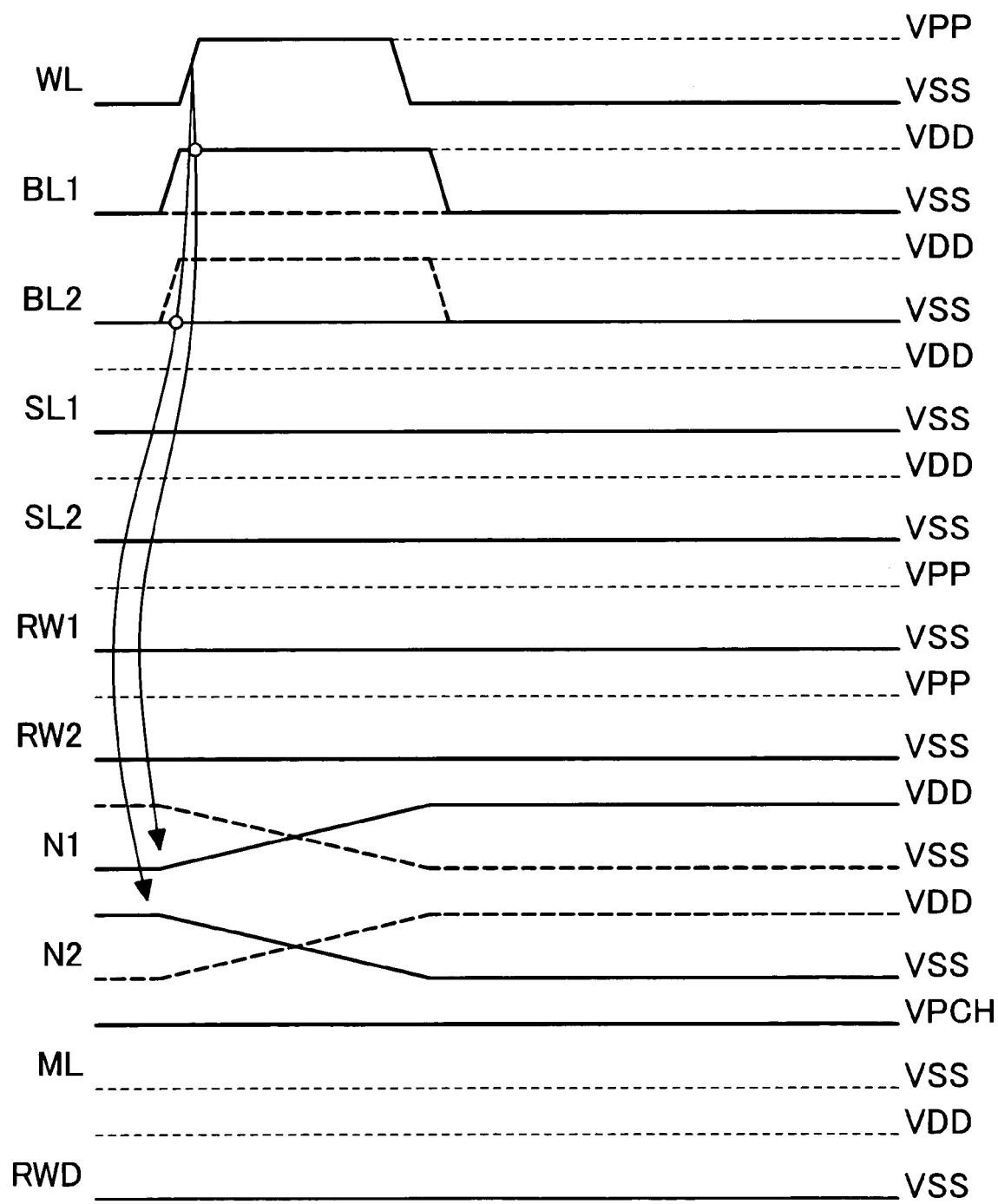
FIG. 5 is a diagram showing the write operation timing of the ternary dynamic CAM cell shown in FIG. 1.

In the wait state, the match line ML is precharged to the precharge voltage VPCH and the other signals (lines) are held at the ground potential VSS. Then, the bit lines BL1 and BL2 are driven to voltages corresponding to an input entry. After that, if the word line WL set at the ground potential VSS has been driven to the boosted dc voltage VPP, the transistors T1 and T2 are turned on. As a result, conduction occurs between the storage nodes N1 and N2 and their corresponding bit lines BL1 and BL2. FIG. 5 shows a reverse data write operation example. The solid lines indicate waveforms illustrating a write operation in which data 0, that is, (0, 1), is overwritten with data 1, that is, (1, 0). The broken lines, on the other hand, indicate waveforms illustrating a write operation in which data 1 is overwritten with data 0. In the case of the reverse data write operation in which data 0 is overwritten with data 1, for example, the bit line BL1 set at the ground potential VSS is driven to the power supply voltage VDD, while the bit line BL2 is held at the ground potential VSS. Then, when the word line WL has been activated, the storage node N1 set at the ground potential VSS is driven to the power supply voltage VDD, and the storage node N2 set at the power supply voltage VDD is driven to the ground potential VSS. When the voltages of the storage nodes N1 and N2 have reached voltage levels substantially equal to those of their corresponding bit lines BL1 and BL2, the word line WL set at the boosted dc voltage VPP is driven to the ground potential VSS, turning off the transistors T1 and T2. Then, the bit lines BL1 and BL2 are driven to the ground potential VSS to return the cell to the wait state, thereby completing the write operation.

The above description explains how to write binary data. In an operation to write data X (the third data) the word line WL is activated with both bit lines BL1 and BL2 held at the ground potential VSS to drive both storage nodes N1 and N2 to the ground potential VSS. As is easily understood from the above description of the operations, in a T-CAM array having the configuration shown in FIG. 4, data is written to all T-DCAM cells connected to a selected word line at the same time. That is, a write operation is carried out on a row basis, as in the dynamic random access memory (DRAM).

<<Description of Search Operation>>

Figure 6:
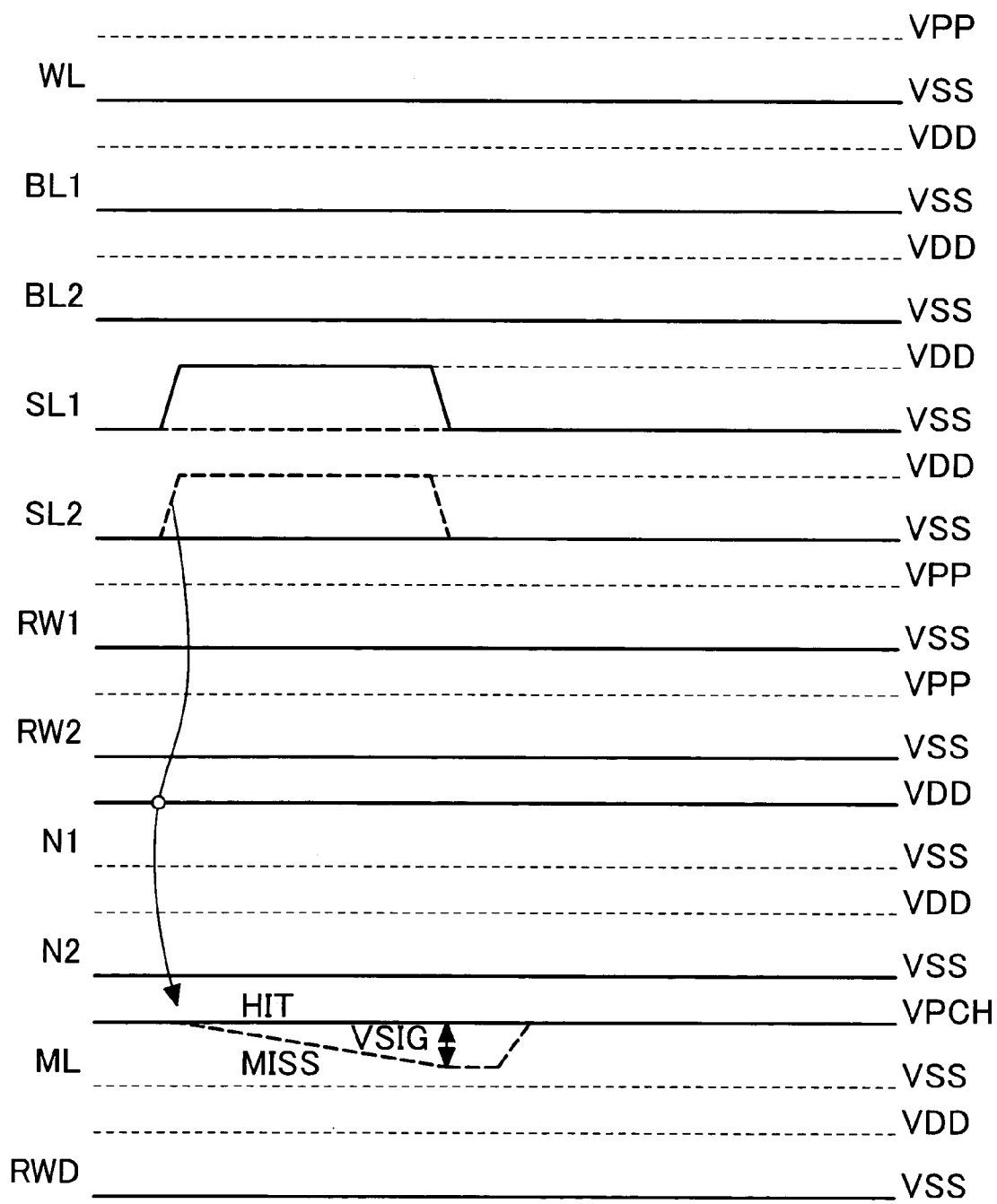
FIG. 6 is a diagram showing the search operation timing of the ternary dynamic CAM cell shown in FIG. 1.

With reference to FIG. 6, description will be made below of the search operation of a T-DCAM cell having the configuration shown in FIG. 1. In this operation, the transistors T3, T4, T5, and T6 are used to perform an XNOR operation to compare a search key and an entry, as in the conventional cell.

First of all, description will be made of search operation on binary data. In the wait state, the match line ML is precharged to the precharge voltage VPCH, and the other signals (lines) are held at the ground potential VSS. When a search operation begins, the search lines SL1 and SL2 are driven to voltages corresponding to an input search key. In FIG. 6, the solid lines indicate waveforms of the search lines in a search operation in which the search key is data 1, that is, (1, 0). The broken lines, on the other hand, indicate waveforms of the search lines in a search operation in which the search key is data 0, that is, (0, 1). The figure also indicates the (voltage) waveforms of the storage nodes when data 1 is stored in the cell. In the case of the search operation for data 1, the search line SL1 set at the ground potential VSS is driven to the power supply voltage VDD with the search line SL2 held at the ground potential VSS, turning off the transistor T3 and turning on the transistor T5. As a result, conduction occurs between the match line ML and the intermediate node M2. At that time, if the T-DCAM cell stores data 1, the transistor T4 is on since the storage node N1 is at a high voltage, and the transistor T6 is off since the storage node N2 is at a low voltage.

Accordingly, no current path is formed between the match line ML and the grounded electrode, and therefore the match line ML is held at the precharge voltage VPCH. This comparison result is hereinafter referred to as a "hit". Though not shown in the figure, if, on the other hand, the T-DCAM cell stores data 0, the transistor T4 is off since the storage node N1 is at a low voltage, and the transistor T6 is on since the storage node N2 is at a high voltage. Accordingly, a current path is formed between the match line ML and the grounded electrode through the intermediate node M2, and the match line ML is discharged from the precharge voltage VPCH toward the grounded potential VSS. This comparison result is hereinafter referred to as a "miss". The search operation for data 0 can be easily understood from the above description of the search operation for data 1. That is, the search line SL2 set at the ground potential VSS is driven to the power supply voltage VDD with the search line SL1 held at the ground potential VSS, turning on the transistor T3 and turning off the transistor T5. As a result, conduction occurs between the match line ML and the intermediate node M1. At that time, if the T-DCAM cell stores data 1, as shown in the figure, the transistor T4 is on since the storage node N1 is at a high voltage, and the transistor T6 is off since the storage node N2 is at a low voltage.

Accordingly, a current path is formed between the match line ML and the grounded electrode through the intermediate node M1, and therefore the match line ML is discharged. That is, the comparison result is a miss. Though not shown in the figure, if, on the other hand, the T-DCAM cell stores data 0, the transistor T4 is off since the storage node N1 is at a low voltage, and the transistor T6 is on since the storage node N2 is at a high voltage. Accordingly, no current path is formed between the match line ML and the grounded electrode, and therefore the match line ML is held at the precharge voltage VPCH. That is, the comparison result is a hit.

When the comparison result is a miss, the search line set at the power supply voltage VDD is driven to the ground potential VSS to turn off the transistors T3 and T5 when the difference between the precharge voltage and the voltage of the match line, which is currently being discharged, has become sufficiently large. This stops the discharge of the match line ML. In the figure, reference numeral VSIG denotes a small voltage difference at which the search line is unactivated. This voltage difference is hereinafter referred to as a compare signal. The value (voltage level) of the compare signal VSIG is small enough for the above compare signal detector to properly discriminate it from the precharge voltage of the match line ML. Lastly, according to the determination (discrimination) result, the compare signal detector outputs a signal to the hit signal bus HBS at full amplitude, and precharges the match line ML, thereby completing the search operation and returning the cell to the wait state.

Description will be made below of the search operation for the third data in a T-CAM. Though not shown in FIG. 6, the search operation for data X or data MASK can be easily understood from the above description of the search operation for binary data. When the entry is data X, the transistors T4 and T6 are turned off since both storage nodes N1 and N2 are held at a low voltage. Therefore, no current path is formed between the match line ML and the grounded electrode whichever search key is entered, holding the match line ML at the precharge voltage VPCH. As a result, the comparison indicates a hit.

When, on the other hand, the search key is data MASK, the mask signal described above forces both search lines to be held at the ground potential VSS. In this case, since the transistors T3 and T5 are off, no current path is formed between the match line ML and the grounded electrode whatever data the entry may be, holding the match line ML at the precharge voltage VPCH. As a result, the comparison also indicates a hit.

FIG. 7 shows truth values for the above operations. Specifically, the search key and the entry each has three possible values, and their combinations (9 combinations) and the corresponding comparison results indicate the 9 search operations carried out in a T-DCAM cell having the configuration shown in FIG. 1.

The above description of the search operations assumes that only a single T-DCAM cell is connected to the match line. In an actual array, however, T-DCAM cells are arranged in a matrix, as shown in FIG. 4, and a plurality of cells are connected to each match line.

Therefore, in a search operation, a match line is held at the precharge voltage VPCH only when all cells connected to it produce a hit. If any one of the cells produces a miss, the match line is discharged, that is, the comparison result is a miss.

<<Description of Refresh Operation>>

Description will be made below of the refresh operation of a T-DCAM cell having the configuration shown in FIG. 1. The refresh operation will be described with reference to FIG. 8 by focusing on cell CL11 in the array configuration shown in FIG. 4 in order to facilitate the understanding of the operation.

Figure 8:
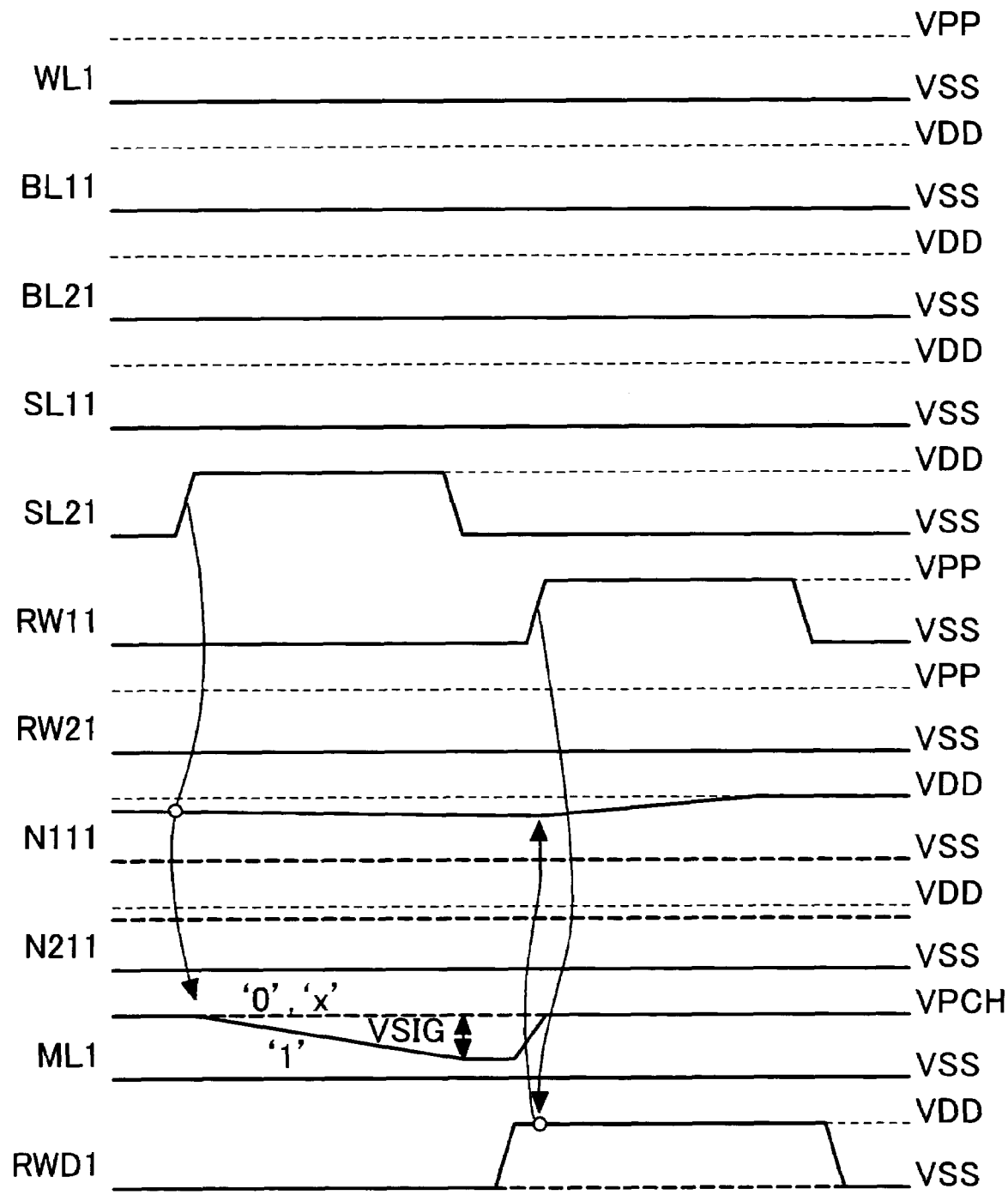
FIG. 8 is a diagram showing the refresh operation timing of the ternary CAM array shown in FIG. 4.

It should be noted that N1jk and N2jk (j=1, 2, ..., m; k=1, 2, ..., n) denote the storage nodes within the cells CLjk, while M1jk and M2jk denotes the intermediate nodes within the cells CLjk. In FIG. 8 showing the (voltage) waveforms of the storage nodes, the solid lines indicate waveforms obtained when the cell CL11 stores data 1, while the broken lines indicate waveforms obtained when the cell CL11 stores data 0. The refresh operation of the present embodiment is characterized by the following two arrangements. One is that each search line is selectively activated to read out stored data for each column and output it to the match line, and then a rewrite operation is carried out for each column by use of the compare signal detector, the rewrite data lines, and the rewrite column select lines. The other arrangement is such that the data stored at each storage node within the cell is sequentially refreshed.

In the wait state, all match lines are precharged to the precharge voltage VPCH, and the other signals (lines) are held at the ground potential VSS. Then, if a column address generated by a refresh counter (described later) has been input to the search/bit line controller SBCTL through the data bus DBS, the search line SL21 set at the ground potential VSS is driven to the power supply voltage VDD with the search line SL11 held at the ground potential VSS, turning off the transistor T5 and turning on the transistor T3. As a result, conduction occurs between the match line ML1 and the intermediate node M111. At that time, if the T-DCAM cell stores data 1, the transistor 4 is on since the storage node N111 is at a high voltage. Therefore, a current path is formed between the match line ML1 and the grounded electrode, and the match line ML1 is discharged from the precharge voltage VPCH toward the ground potential VSS. If, on the other hand, the T-DCAM cell stores data 0 or data X, the transistor 4 is off since the storage node N111 is at a low voltage. Therefore, no current path is formed between the match line ML1 and the grounded electrode, and the match line ML1 is held at the precharge voltage VPCH.

As in the search operation described above, when the difference between the precharge voltage VPCH and the voltage of the match line, which is currently being discharged, has become equal to (the voltage level of) the compare signal VSIG (corresponding to the read signal), the search line SL2 set at the power supply voltage VDD is driven to the ground potential VSS, thereby completing the reading of the stored data.

Then, the compare signal detector CSDTC discriminates the voltage of the match line ML1 and outputs to the rewrite data line RWD1 a signal having a voltage level corresponding to the discrimination result. Having completed the discrimination of the compare signal, the compare signal detector CSDTC can precharge the match line ML1 to the precharge voltage VPCH for the wait state, as shown in FIG. 8. Furthermore, since the column address generated from the refresh counter has also been input to the rewrite column select circuit, a rewrite line RW21 corresponding to the search line SL21 is driven from the ground potential VSS to the boosted dc voltage VPP. Thus, the transistor T7 is turned on to rewrite to the storage node N111. Lastly, when the voltage of the storage node N111 has reached a voltage level substantially equal to that of the rewrite data line RWD1, the rewrite line RW21 set at the boosted dc voltage VPP is driven to the ground potential VSS and furthermore the rewrite data line RWD1 is also driven to the ground potential VSS, thereby returning the cell to the wait state. It should be noted that even though the above description focuses on the cell CL11, the storage nodes N1j1 (j=2, 3, . . . , m) within the cells CLj1 in the same column as the CL11 are refreshed in the same manner through their corresponding match lines and rewrite data lines (at the same time).

The foregoing is a description of the portion of the refresh operation executed in a first single access. There are two method of refreshing (the other storage nodes in the same column and the storage nodes of) the remaining cells, as described below. One method is to first access the other storage nodes in the same column, and then access the storage nodes in the next column by incrementing the refresh counter. Specifically, first the search line SL21 is activated to refresh the storage nodes N1j1 (j=1, 2, . . . , m) within the cells CLj1 (j=1, 2, . . . , m), as described above. Then, the search line SL11 is activated according to an internal control signal (described later) to refresh the storage nodes N2j1 (j=1, 2, . . . , m). After thus refreshing the cells CLj1 in the first column, the refresh counter is incremented to refresh the cells CLj2 (j=1, 2, . . . , m) in the second column. These operations are repeated on the subsequent columns to refresh all cells. This type of refresh operation provides longer intervals between transitions in the column address signal, making it possible to reduce the power consumption of the refresh counter and the data bus DQS.

The other method is to increment the refresh counter each time access is made so as to access a subsequent column. First of all, the search line SL21 is activated to refresh the storage nodes N1j1 (j=1, 2, . . . , m) within the cells CLj1 (j=1, 2, . . . , m) in the first column, as described above. After thus refreshing the storage nodes N1j1, the refresh counter is incremented and thereby the search line SL22 is activated to refresh the storage nodes N1j2 (j=1, 2, . . . , m) within the cells CLj2 (j=1, 2, . . . , m) in the second column. These operations are repeated on the subsequent columns to refresh the storage nodes N1jk (j=1, 2, . . . , m; k=1, 2, . . . , n) on one side. Then, the search lines SL1k (k=1, 2, . . . , n) are sequentially activated according to the internal control signal to refresh the other storage nodes N2jk (j=1, 2, . . . , m; k=1, 2, . . . , n). At that time, the refresh counter is incremented each time access to a next column is to be made.

It should be noted that the read operation on the cell shown in FIG. 1 is similar to the above refresh operation, as described in detail later. Therefore, the read operation requires a counter for generating a column address. The above refresh counter (for the first access method) may be used as this counter, making it possible to reduce the chip area. Further, if the refresh counter for implementing the second access method is used as this counter, since the number of accesses required for the second access method to read out all data within the array is half of that for the first access method, the time required for the read operation can be reduced.

<<Description of Read Operation>>

Figure 9:
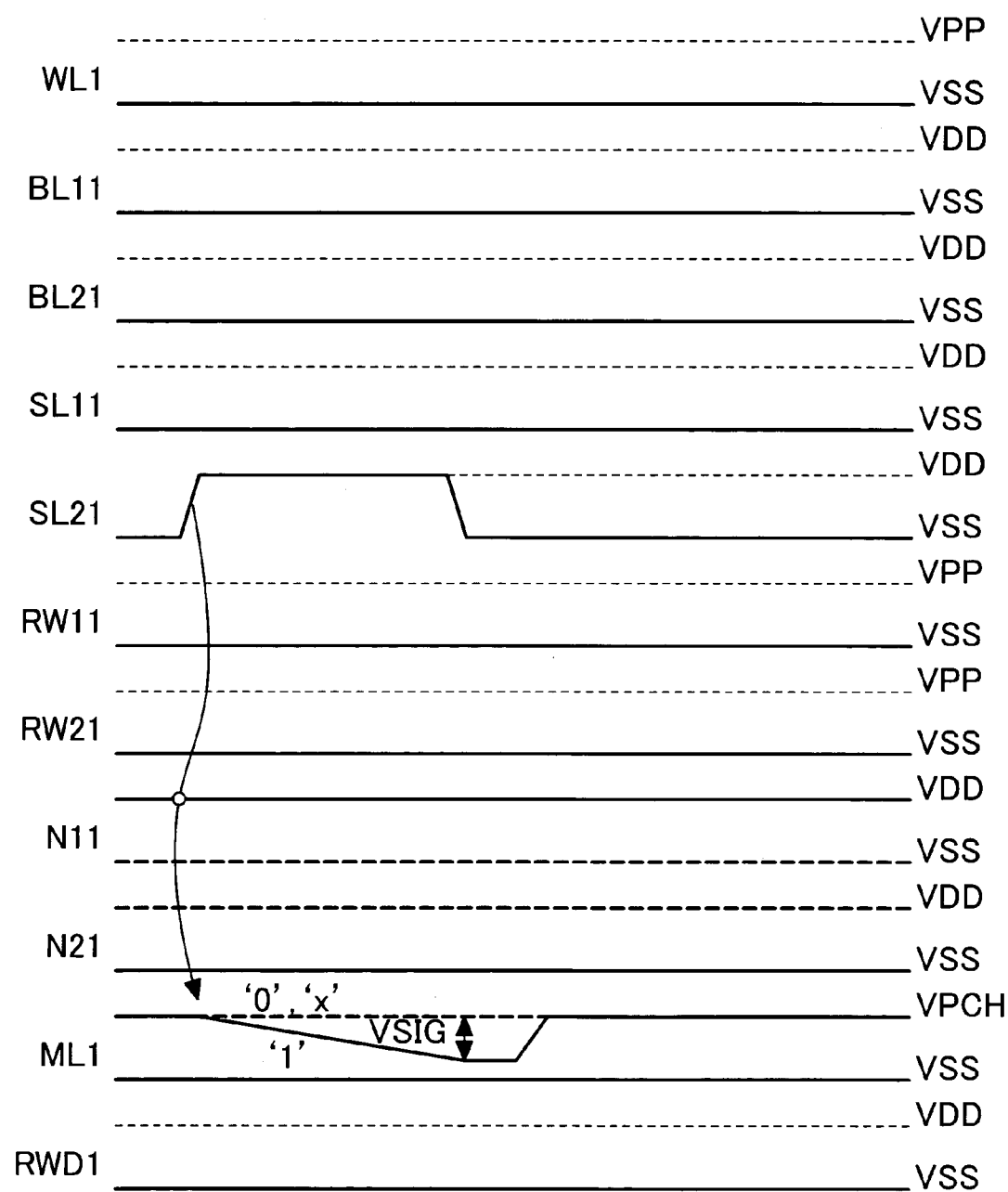
FIG. 9 is a diagram showing the read operation timing of the ternary CAM array shown in FIG. 4.

With reference to FIG. 9, description will be made below of the read operation of a T-DCAM cell having the configuration shown in FIG. 1. The read operation of the present embodiment has the following three characteristics. First, as in the read operation for the refresh operation, a search line is selected to read out stored data and output it to the match line, and then the compare signal detector discriminates the read signal (corresponding to the comparison signal). Second, it is a nondestructive readout. The third characteristic is that access is repeated on a column basis to read out the entry at a desired row address one bit at a time. The following description of the operation assumes that in the array configuration shown in FIG. 4, the first entries of the cells CL1k (k=1, 2, . . . , n) in the first row are to be read out, and focuses on the cell CL11.

In the wait state, all match lines are precharged to the precharge voltage VPCH, and the other signals (lines) are held at the ground potential VSS. Then, if a column address generated by a read counter (described later) has been input to the search/bit line controller SBCTL through the data bus DBS, the search line SL21 set at the ground voltage VSS is driven to the power supply voltage VDD, thereby driving the match line ML1 to a voltage corresponding to the data stored in the cell CL11.

Then, as in the search and refresh operations described above, when the difference between the precharge voltage VPCH and the voltage of the match line ML1, which is currently being discharged, has become equal to (the voltage level of) the compare signal VSIG, the search line SL21 set at the power supply voltage VDD is driven to the ground potential VSS, completing the reading of the cells CLj1 (j=1, 2, . . . , m) in the first column. Subsequently, the compare signal detector CSDTC discriminates the voltage of the match line ML1 and outputs to the hit signal bus HBS a signal having a voltage level corresponding to the discrimination result. Lastly, the compare signal detector CSDTC precharges the match line ML1 to the precharge voltage VPCH, thereby returning the CAM array to the wait state.

It should be noted that here no rewrite operation is required for T-DCAM cells having the configuration shown in FIG. 1. The reason for this is that the storage nodes of a cell are kept in a floating state while the cell is being accessed. This means that there exists nothing that affects the stored charge except for small leakage currents of the transistors T1, T2, T7, and T8. That is, the above operation is a so-called "nondestructive" read operation. It should be noted that even though the above description focuses on the cell CL 11, the data stored within the cells CLj1 (j=2, 3, . . . , m) in the same column as the CL11 are also read out to their corresponding match lines in the same manner, and signals corresponding to the discrimination results are output to the hit signal bus HBS. The data thus read out from the cells CLj1 (j=1, 2, . . . , m) in the first column is transferred to a multiplexer (described later) through the hit signal bus HBS. Then, the data from the cell CL11 at the desired row address is selected and transferred to the read register (described later).

This completes the read operation on the entry in the desired first-row first-column cell. As is easily understood, the data of the cells in the second and subsequent columns is read out in the same manner. That is, in the read operation on the second column, the read counter is incremented to drive the search line SL22 set at the ground potential VSS to the power supply voltage VDD and thereby read from the cells CLj2 (j=1, 2, . . . , m) in the second column. That is, in the present read operation, the data in each column is serially read out. It should be noted that as described in connection with the refresh operation, the refresh counter may be used as the read counter for generating a column address, making it possible to reduce the chip area.

<<Overall T-CAM Configuration Example>>

Figure 10:
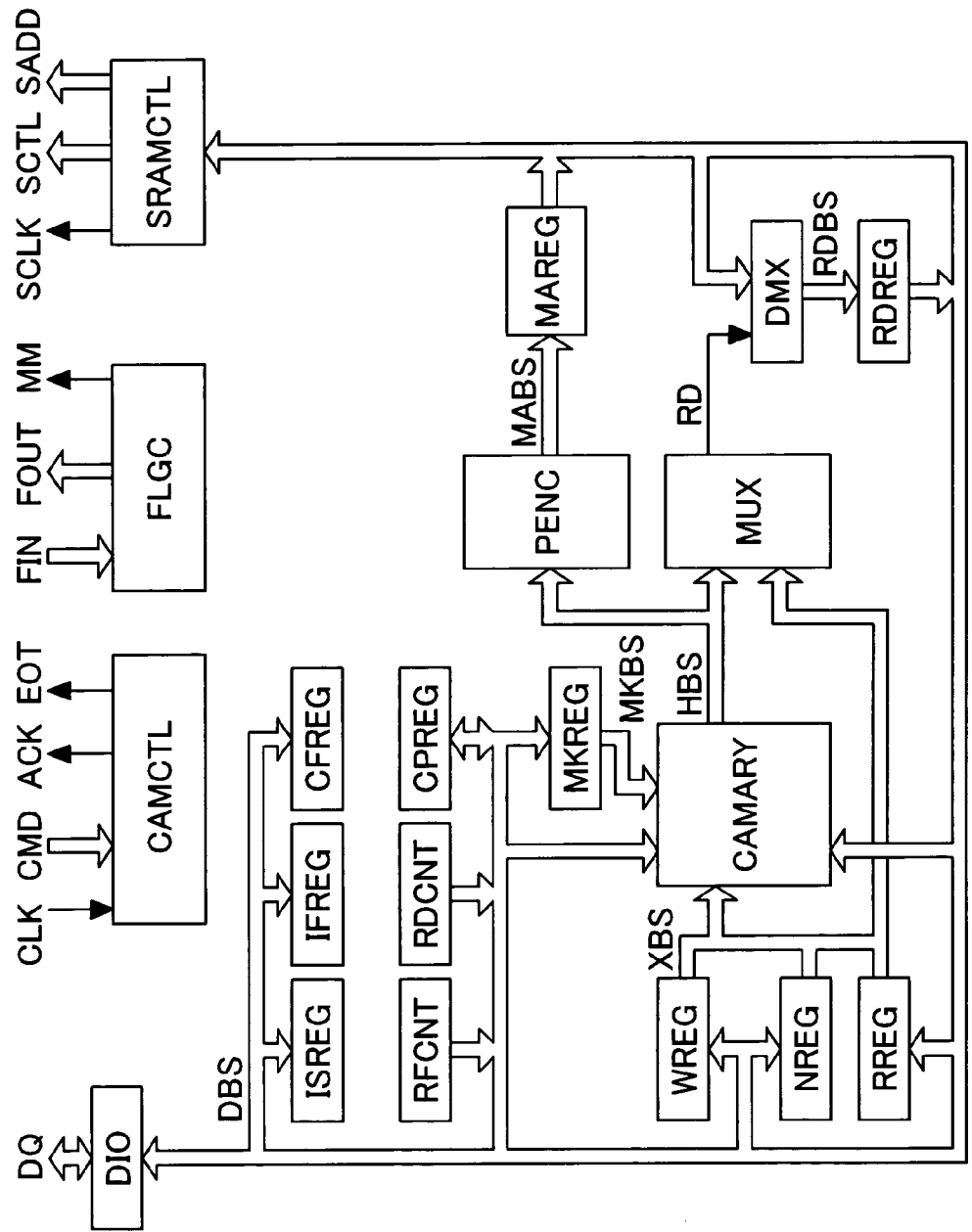
FIG. 10 is a block diagram showing a configuration example of a ternary CAM using the ternary dynamic CAM cell shown in FIG. 1.

Description will be made below of an overall configuration of a T-CAM employing a T-CAM array having the above array configuration which includes T-DCAM cells having the above cell configuration (the operations of a T-CAM array having such an array configuration and T-DCAM cells having such a cell configuration are also described above). FIG. 10 is a block diagram showing the main components of the T-CAM. The T-CAM comprises a CAM array CAMARY, a data input/output circuit DIO, registers, a CAM controller CAMCTL, a flag logic circuit FLGC, a refresh counter RFCNT, a read counter RDCNT, a priority encoder PENC, a multiplexer MUX, a demultiplexer DMX, and a static random access memory (SRAM) controller SRAMCTL. The CAM array CAMARY has the configuration shown in FIG. 4. The data input/output circuit DIO is disposed between multiple external data DQ and a data bus DBS within the chip, and transmits/receives data, address signals, and control signals for establishing various settings of the chip.

The registers have a number of bits corresponding to the number of signal lines for their corresponding external data DQ. The figure shows two registers for receiving data through the data bus DBS: a mask register MKREG and a comparand register CPREG. The first mask register MKREG stores data for generating the third data X or MASK for a desired bit and inputs it to the CAM array CAMARY through a mask signal bus MKBS. The comparand register CPREG stores the search key entered in a search operation. This search key is written into the CAM array CAMARY when no entry coinciding with the search key has been found in the search operation.

The figure further shows three registers for receiving an address signal through the data bus DBS: a burst write register WREG, a next-free-address register NREG, and a burst read register RREG. The burst write register WREG stores a row address and a burst length for the first cycle in a burst write operation, and automatically counts up so as to generate addresses for the second and subsequent cycles after the burst write operation has begun. The next-free-address register NREG stores a row address at which no entry exists. The burst read register RREG stores a row address and a burst length for the first cycle in a burst read operation, and automatically counts up so as to generate addresses for the second and subsequent cycles after the burst read operation has begun. The address signals generated by these registers are input to the CAM array CAMARY and the multiplexer MUX (described later) through the row address bus XBS.

The figure still further shows three registers for receiving control signals through the data bus DBS: an instruction register ISREG, an information register IFREG, and a configuration register CFREG. The instruction register ISREG stores control signals entered through the data bus DBS and defines the chip initialization method, the number of T-CAM chips connected in series, and the table configuration within the chip. It should be noted that the table configuration is a configuration of logical CAM arrays determined according to the number of entries and the bit width of the entries. The information register IFREG stores a unique device number assigned to the chip in the system. The configuration register CFREG stores, for example, a multiple match signal (described later) for controlling activation of the CAM array CAMARY logically divided as described above, and an enable signal for indicating whether or not each SRAM clock is valid.

In addition, FIG. 10 also shows a match address bus MABS, a match address register MAREG inserted between a read data bus RDBS and the data bus DBS, and a read data register RDREG.

The CAM controller CAMCTL generates a read acknowledge signal ACK, an end-of-transfer signal EOT, and internal command signals according to an input external clock CLK and multiple external command signals CMD. The external command signals CMD are generated from an external control chip using an application specific integrated circuit (ASIC), etc. The read acknowledge signal ACK is a strobe signal output in synchronization with the read data during a read operation, while the end-of-transfer signal EOT is a flag signal output in synchronization with the final data in a burst read operation.

It should be noted that the internal command signals are omitted from the figure for simplicity. In reality, however, a plurality of command signals are distributed to each circuit block according to the operation. One of these command signals is output to the CAM array CAMARY to, for example, selectively activate the search lines and the rewrite select lines, as described in connection with the refresh operation.

A flag logic circuit FLGC is used to exchange full signals between T-CAM chips. For example, to achieve a high speed table search operation in a router, a plurality of T-CAMs are generally connected in series so as to create a search table having a large capacity. Therefore, multiple full-in signals FIN and multiple full-out signals FOUT are exchanged between chips to check the use conditions of each CAM array and control to which CAM array a new entry is to be entered for storage. In addition, the flag logic circuit FLGC activates a multiple match signal MM when a plurality of entries have been hit in a search operation. The refresh counter RFCNT generates a column address according to the refresh operation. This address is input to the CAM array CAMARY through the data bus DBS. The read counter RDCNT generates a column address according to the read operation. This address is also input to the CAM array CAMARY through the data bus DBS. It should be noted that as described in connection with the refresh operation, a single counter may be used as both the refresh counter and the read counter, making it possible to reduce the chip area.

In a search operation, according to a signal entered from the hit signal bus HBS, the priority encoder PENC generates an address signal corresponding to an entry which has been found to coincide with the search key. It should be noted that the priority encoder PENC has a function to, if a plurality of entries have been hit, sequentially output address signals corresponding to them in the order of decreasing priority (for example, the entry whose corresponding row address is the lowest has the highest priority). The generated address signals are input to the match address register MAREG through the match address bus MABS.

The multiplexer MUX receives signals from the hit signal bus HBS, selects one which corresponds to the row address stored in the above burst read register RREG, and outputs it to a read data line RD. The demultiplexer DMX transfers the data input from the read data line RD to the signal line of the read data bus RDBS whose column number corresponds to the column address generated by the above read counter RDCNT.

According to a signal input from the data bus DBS, the SRAM controller SRAMCTL outputs a signal for controlling SRAM(s) operating with this T-CAM. FIG. 10 shows a SRAM clock SCLK, multiple SRAM control signals SCTL, and a SRAM address SADD. The multiple SRAM control signals SCTL include, for example, a chip enable signal and a write enable signal. The SRAM address SADD is the address signal generated by the priority encoder PENC as described above. When a plurality of address signals have been generated, the SRAM controller SRAMCTL sequentially outputs addresses entered through the data bus DBS from the match address register MAREG.

With this arrangement, a T-CAM employing T-DCAM cells having the configuration shown in FIG. 1 can perform various operations as follows. An entry can be input to the CAM array CAMARY through the data bus DBS by use of the burst write register WREG and the next-free-address register NREG. Further, a search key can be input to the CAM array CAMARY through the data bus DBS to perform a search operation. At that time, if an entry coinciding with the search key is found, the priority encoder PENC can generate an address signal corresponding to the entry and output it to an external SRAM through the match address register MAREG and the SRAM controller SRAMCTL.

Still further, a column address generated by use of the refresh counter RFCNT can be input to the CAM array CAMARY through the data bus DBS to perform a refresh operation through the match lines and the rewrite data lines as described above. Still further, column and row addresses can be generated by use of the read counter RDCNT and the burst read register RREG, respectively, and thereby a desired entry in the CAM array CAMARY can be read by use of the multiplexer MUX, the demultiplexer DMX, and the read data register RDREG through serial-to-parallel conversion, as described above.

<<T-DCAM Cell Structure Example>>

Description will be made below of a structure example of the T-DCAM cell shown in FIG. 1. FIGS. 11 to 14 show portions of the layout of a T-CAM array. This structure is characterized in that all transistors are planner transistors, and the internal nodes are connected to one another by use of a manufacturing technique called "shared contact", which is widely used for SRAMs. In these figures, each rectangle CAREA depicted by a thick broken line indicates the area of a single cell and therefore should not be confused with any layout pattern. Further, even though the figures show only boundary portions of the neighboring cells, each neighboring cell is disposed such that it is symmetrical to the target cell about one of the four sides of the rectangle CAREA.

First of all, FIG. 11 will be described. The figure shows a first metal layer and the layers thereunder. Reference numeral FL denotes the patterns of active areas; FP, the pattern of a first polysilicon layer on a silicon substrate for forming therein the gate electrodes of transistors, word lines WL, etc.; FTM, the pattern of the first metal layer for forming a rewrite data line RWD, etc. therein; FCT, the pattern of a first contact for connecting an active area and the first metal layer; GCT, the pattern of a gate contact for connecting the first polysilicon layer and the first metal layer; and SHC, the pattern of a shared contact for connecting an active area and the first polysilicon layer.

Figure 11:
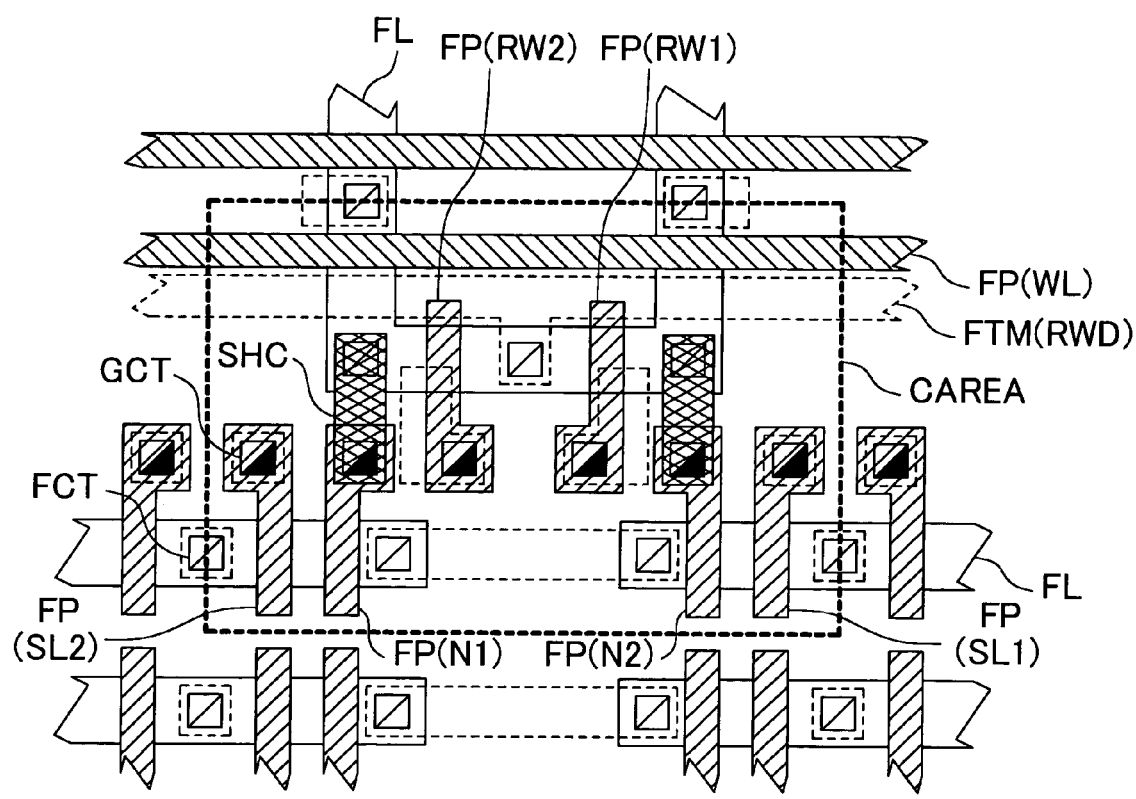
FIG. 11 is a diagram showing a first portion of a layout example of a ternary dynamic CAM cell using planar transistors.
Figure 12:
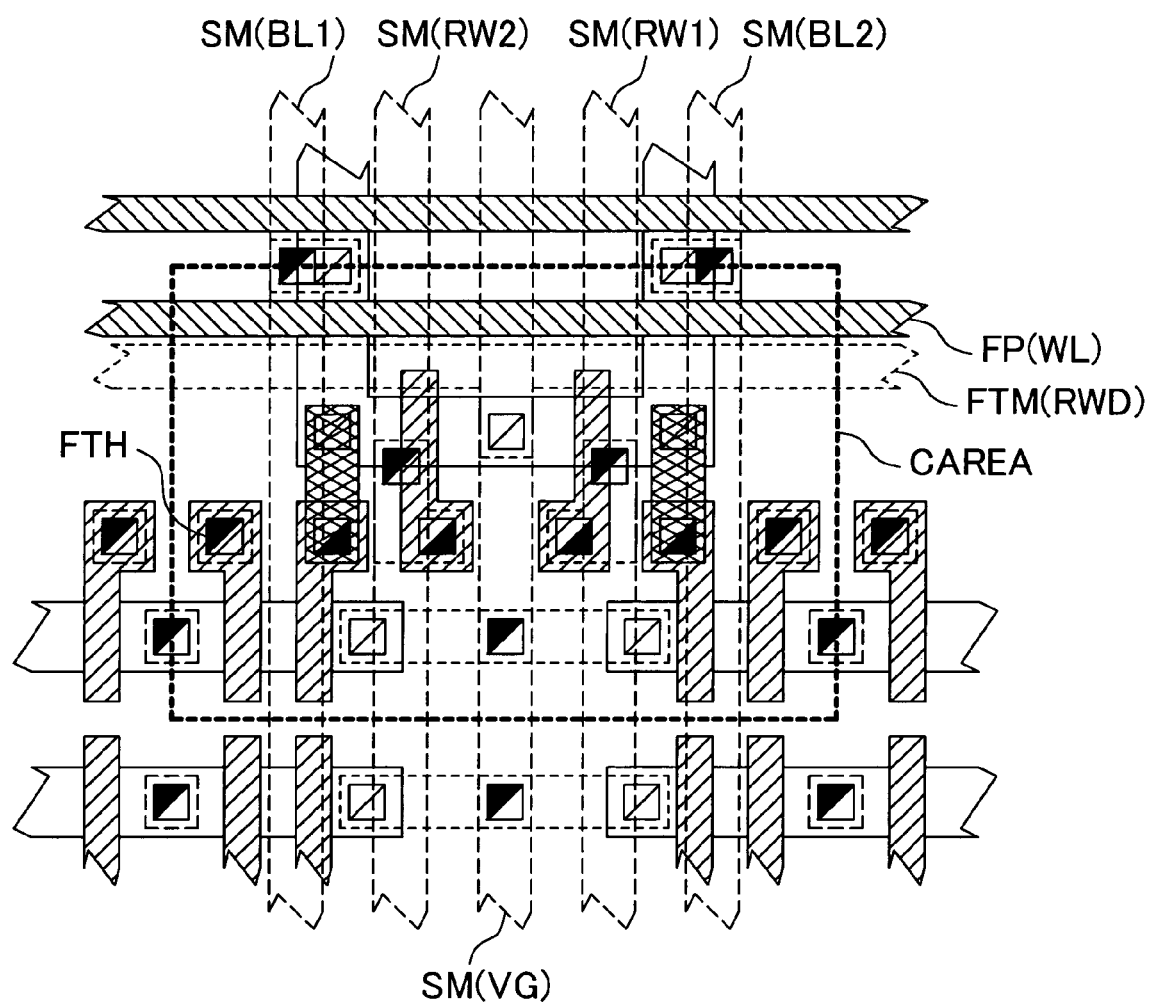
FIG. 12 is a diagram showing a second portion of the layout example of the ternary dynamic CAM cell using the planar transistors.

FIG. 12 will be described below. In the figure, the following two patterns are added to the layout shown in FIG. 11. Reference numeral SM denotes the pattern of a second metal layer for forming therein bit lines BL1 and BL2, rewrite column select lines RW1 and RW2, a ground potential VSS supply line VG, etc. Reference numeral FTH denotes the pattern of a first throughhole for connecting the first metal layer and the second metal layer.

Figure 13:
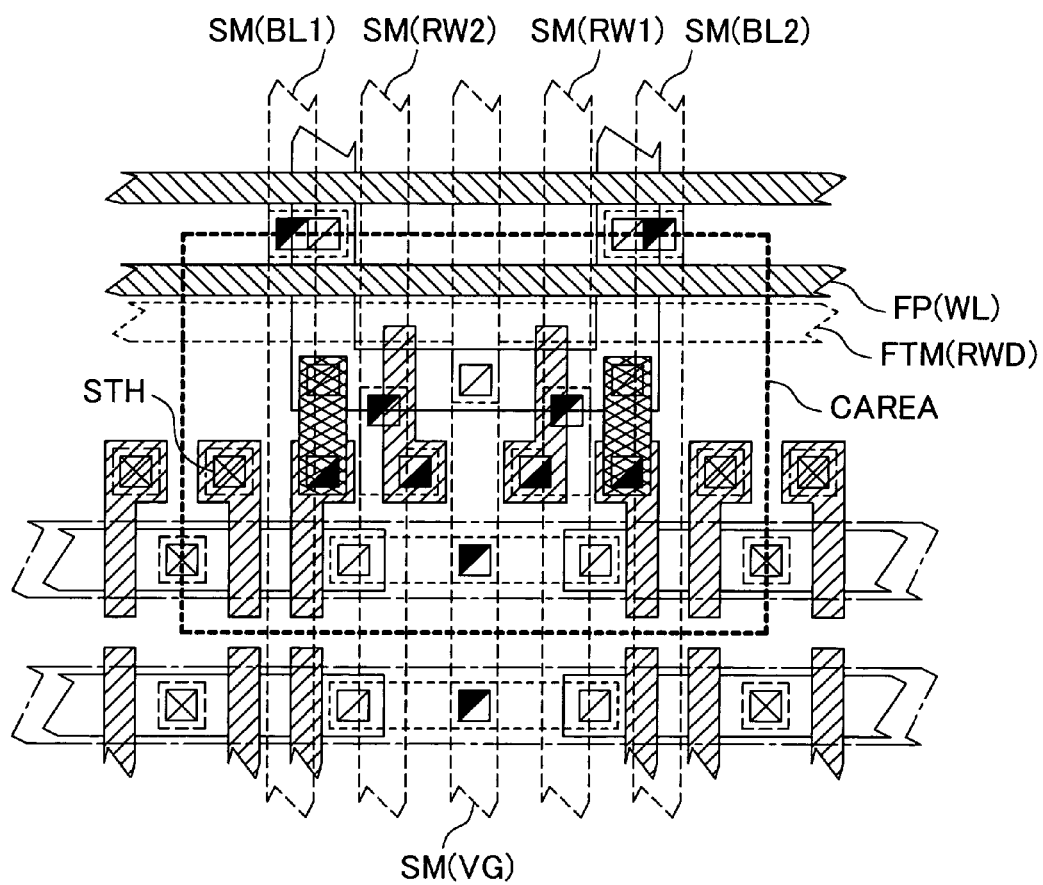
FIG. 13 is a diagram showing a third portion of the layout example of the ternary dynamic CAM cell using the planar transistors.

FIG. 13 will be described below. In the figure, the following two patterns are added to the layout shown in FIG. 12. Reference numeral TM denotes the pattern of a third metal layer for forming a match line ML therein, while STH denotes the pattern of a second throughhole for connecting the second metal layer and the third metal layer.

Lastly, FIG. 14 will be described below. In the figure, the following two patterns are added to the layout shown in FIG. 13. Reference numeral FRM denotes the pattern of a fourth metal layer for forming search lines SL1 and SL2 therein, while TTH denotes the pattern of a third throughhole for connecting the third metal layer and the fourth metal layer. These patterns are formed by use of a known photolithographic technique. It should be noted that the figures indicate each pattern name with its corresponding node (or line) name in parentheses next to it. Therefore, it will be easily understood that the T-DCAM cell is located at (or located in an area roughly defined by) the intersection points between the word line WL and the pair of bit lines or search lines and between the match line ML and the pair of bit lines or search lines.

Figure 14:
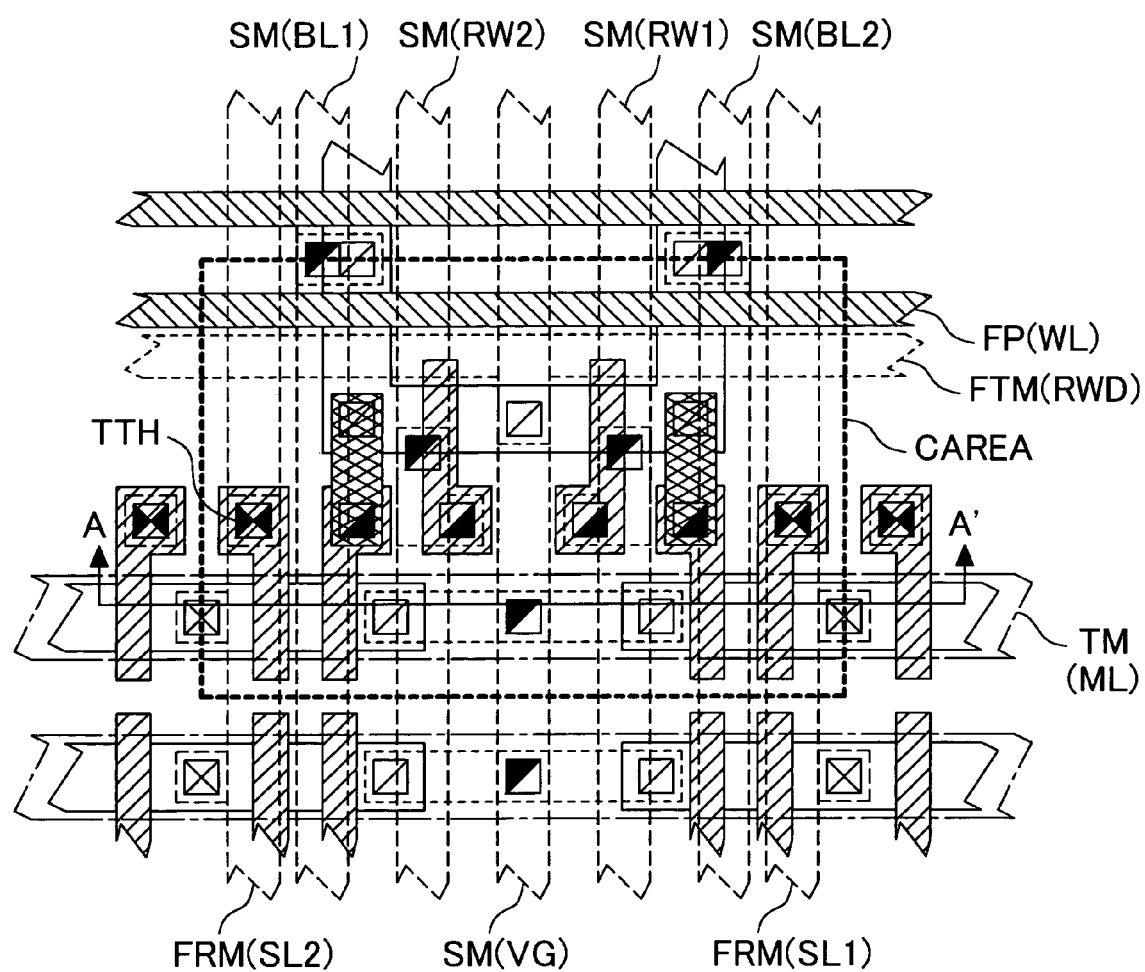
FIG. 14 is a diagram showing a fourth portion of the layout example of the ternary dynamic CAM cell using the planar transistors.
Figure 15:
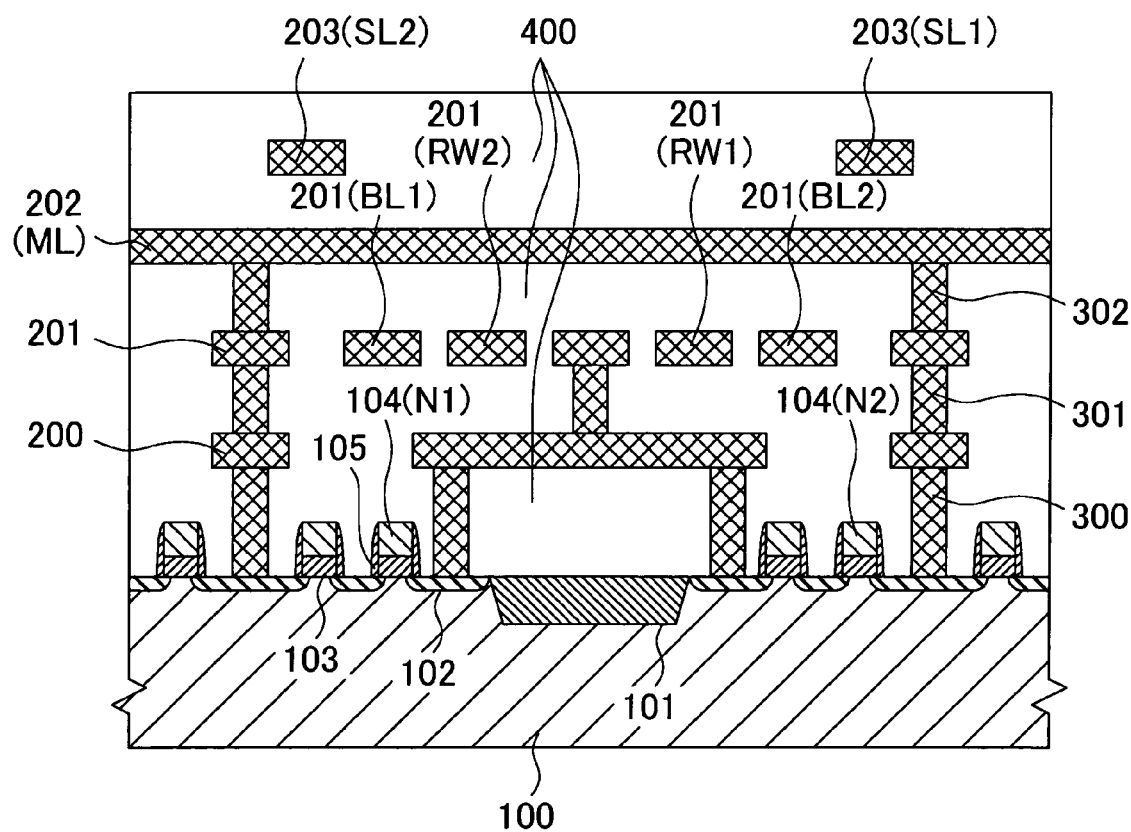
FIG. 15 is a cross-sectional view of the layout structure in FIG. 14 taken along line A–A'.

FIG. 15 is a schematic cross-sectional view of the structure shown in FIG. 14 taken along line A—A'. Reference numeral 100 denotes a p type semiconductor substrate; 101, an insulator buried within the p type semiconductor substrate for separating the device; 102, an n type diffusion layer region in the pattern of an active area FL shown in FIG. 4; 103, the gate oxide film of a transistor formed on the substrate; 104, the gate electrode of the transistor formed on the substrate; and 105, a sidewall made up of an insulation film provided on the transistor formed on the substrate. Further, reference numeral 200 denotes the first metal layer used as the rewrite data line RWD, etc.; 201, the second metal layer used as the bit lines BL, the rewrite column select lines RW, etc.; 202, the third metal layer used as the match line ML, etc.; and 203, the fourth metal layer used as the search lines SL. Still further, reference numeral 300 denotes a first contact for connecting the n type diffusion layer region 102 and the first metal layer; 301, a first throughhole for connecting the first metal layer and the second metal layer; 302, a second throughhole for connecting the second metal layer and the third metal layer; and 400, an interlayer insulation film. This figure also indicates each layer name with its corresponding node (or line) name in parentheses next to it, as in FIGS. 11 to 14. For example, the arrangement of the transistors T3, T4, T5, and T6 for performing XNOR operation can be easily understood from the node name of each gate electrode indicated by reference numeral 104 in FIG. 15.

The T-DCAM cell of the present embodiment employs shared contact patterns as shown in FIG. 11, making it possible to reduce the area required for connecting the internal nodes. Assume that the following four rules are applied to the layouts shown in FIGS. 11 to 14. First, the minimum value for the wiring width and wiring interval of each layer is set to F (F: minimum feature size). Second, the patterns of each contact and each throughhole are square with a side dimension of F. Third, the optical alignment margins between the active areas and the first contacts and between the first polysilicon (layer) and the gate contacts are set to (0.5)*F. The fourth rule is such that the optical alignment margins for connection between each contact and each metal layer and between each throughhole and each metal layer are set to zero. With these layout rules, ground potential VSS supply lines VG can be disposed at a pitch of 19*F. and word lines WL can be disposed at a pitch of (13.5)*F, making it possible to produce a T-DCAM cell having a cell area of (256.5)*F$^2$.

The effects of the above T-DCAM cell configurations and operations are summarized as follows.

First, the T-DCAM cell of the present embodiment is configured such that the rewrite data line RWD is provided in parallel with the match line ML, and the transistors T7 and T8 are inserted between the rewrite data line RWD and the storage nodes N1 and N2, respectively, allowing stored data to be read out to the match line ML and refreshed. Thus, the T-DCAM cell of the present embodiment is composed of only transistors. When data is read out from the memory cell, which has a small storage node capacity, a read signal is generated or not generated generally depending on whether a current path is formed between a signal line having a sense amplifier connected thereto and the grounded electrode through a transistor channel in which the gate electrode forms a storage node. In the configuration shown in FIG. 1, the search operation and the refresh operation are carried out by use of a common current path formed between the match line ML and the grounded electrode, making it possible to perform refresh operation without reducing the XNOR operation speed. Thus, this arrangement allows providing a high-speed T-CAM array employing T-DCAM cells made up of only transistors.

Second, the T-DCAM cell of the present embodiment performs a refresh operation as described above in which the stored data is not read out to the bit line BL, eliminating the need for providing a sense amplifier for each bit line, which is required by a conventional T-CAM, making it possible to reduce the array area as much. As a result, a highly integrated T-CAM array can be produced, resulting in a T-CAM having a large capacity and a high cell occupancy ratio.

Second Embodiment

Description will be made below of another T-DCAM cell structure example. This structure is characterized in that vertical transistors are used as the transistors T1, T2, T7, and T8 in the configuration shown in FIG. 1. The following description assumes that the vertical transistors are as described in FIG. 1 of Japanese Laid-Open Patent Publication No. 2000-269457. The structure will be described with reference to FIGS. 16, 17, 18, 19, and 20. These figures show portions of the layout of a T-CAM array. In the figures, each rectangle CAREA depicted by a thick broken line indicates the area of a single cell and therefore should not be confused with any layout pattern. Further, even though the figures show only boundary portions of the neighboring cells, each neighboring cell is disposed such that it is symmetrical to the target cell about one of the four sides of the rectangle CAREA.

First of all, FIG. 16 will be described. The figure shows a second metal layer and the layers thereunder. Reference numeral FL denotes the pattern of an active area; FP, the pattern of a first polysilicon layer on a silicon substrate for forming therein the gate electrodes of transistors, search lines SL, etc.; SP, the pattern of a second polysilicon layer for forming the drain electrodes of the vertical transistors therein; FCT, the pattern of a first contact for connecting the active area and a first metal layer; SCT, the pattern of a second contact for connecting the second polysilicon layer and the first metal layer (described later); and GH, the pattern of a gate hole for forming the gate electrode of a vertical transistor.

Figure 16:
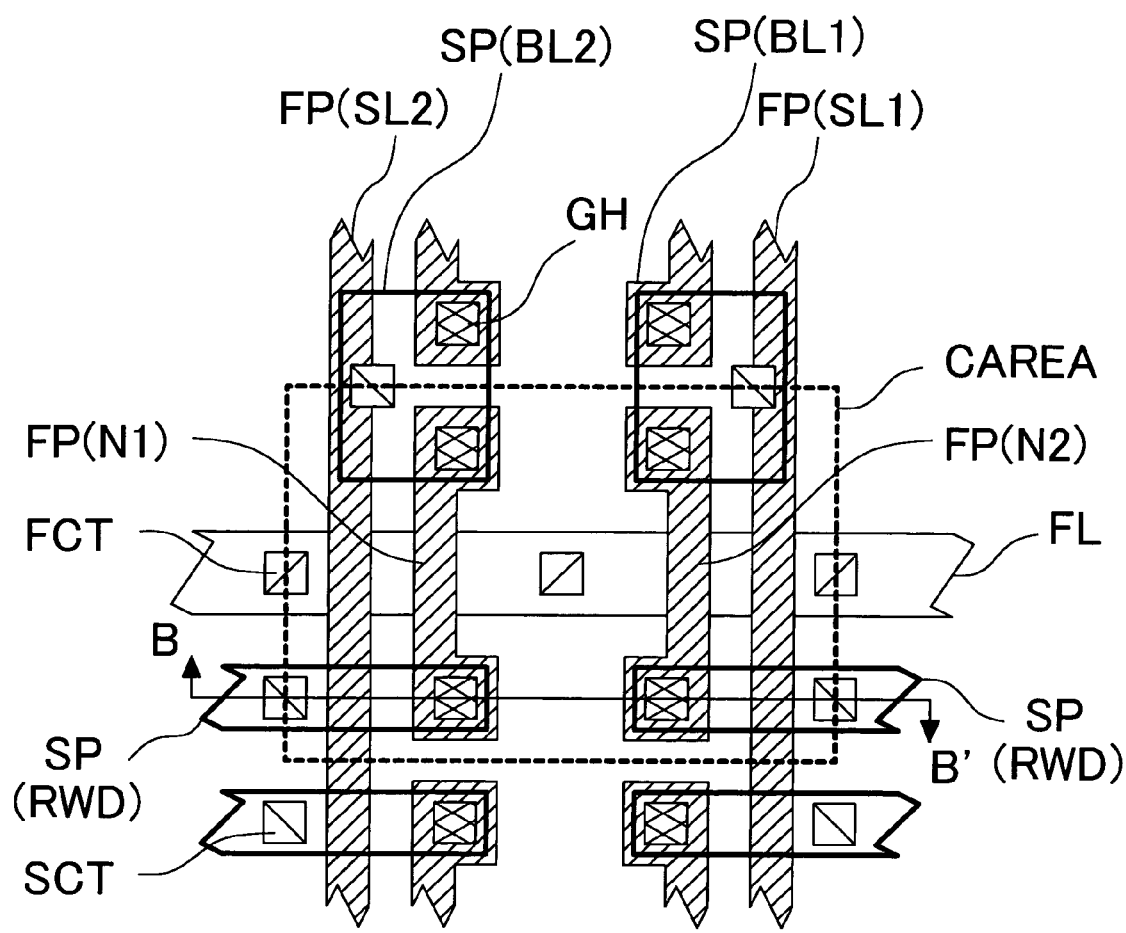
FIG. 16 is a diagram showing a first portion of a layout example of a ternary dynamic CAM cell using vertical transistors.
Figure 17:
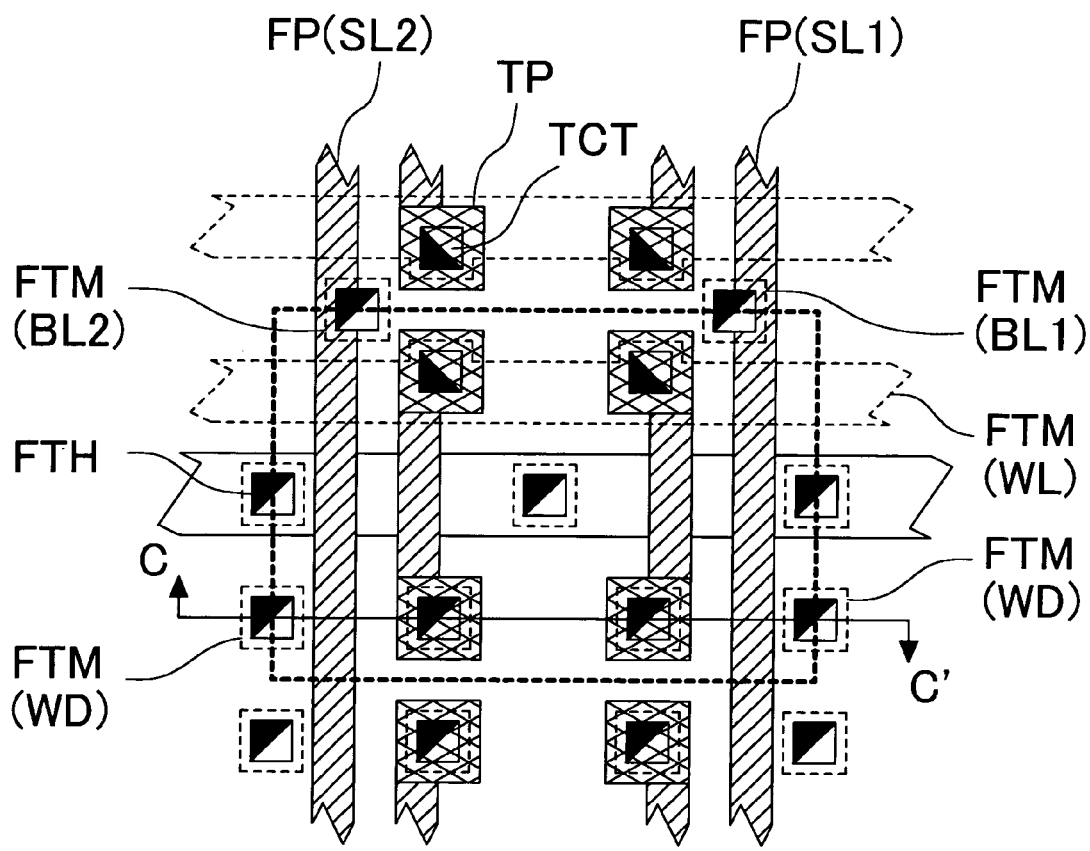
FIG. 17 is a diagram showing a second portion of the layout example of the ternary dynamic CAM cell using the vertical transistors.

FIG. 17 will be described below. The figure shows the first metal layer and the layers thereunder. The following four patterns are added to the layout shown in FIG. 16. It should be noted that the second polysilicon layer SP is omitted from FIG. 17, for simplicity. Reference numeral FTM denotes the pattern of the first metal layer for forming a word line WL, etc. therein; FTH, the pattern of a first throughhole for connecting the first metal layer and a second metal layer (described later); TP, a third polysilicon layer formed as a buffer layer for connecting the gate electrode of a vertical transistor and the first metal layer; and TCT, the pattern of a third contact for connecting the third polysilicon layer and the first metal layer.

Figure 18:
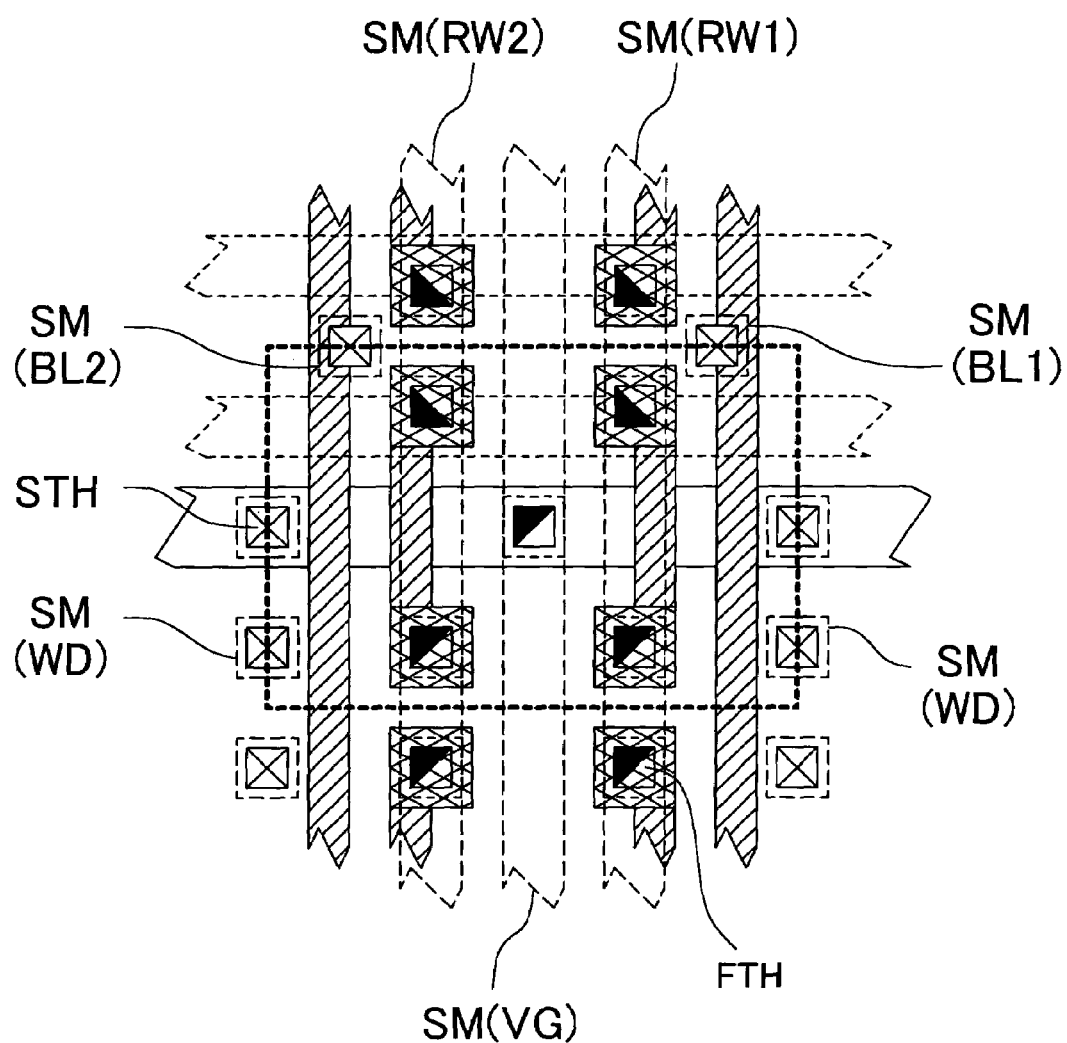
FIG. 18 is a diagram showing a third portion of the layout example of the ternary dynamic CAM cell using the vertical transistors.

FIG. 18 will be described below. In the figure, the following two patterns are added to the layout shown in FIG. 17. Reference numeral SM denotes the pattern of the second metal layer for forming therein rewrite column select lines RW, a ground potential VSS supply line VG, etc.; and STH denotes the pattern of a second throughhole for connecting the second metal layer and a third metal layer.

Figure 19:
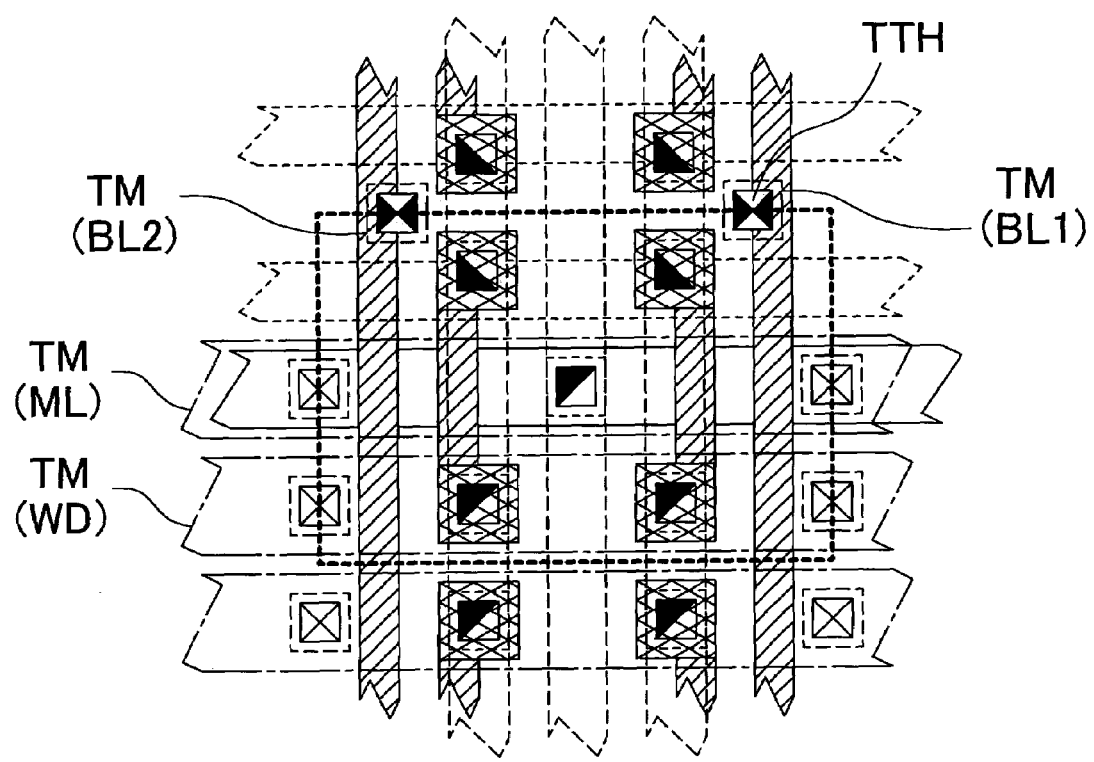
FIG. 19 is a diagram showing a fourth portion of the layout example of the ternary dynamic CAM cell using the vertical transistors.

FIG. 19 will be described below. In the figure, the following two patterns are added to the layout shown in FIG. 18. Reference numeral TM denotes the pattern of the third metal layer for forming therein a match line ML, a rewrite data line WRD, etc.; and TTH denotes the pattern of a third throughhole for connecting the third metal layer and a fourth metal layer (described later).

Figure 20:
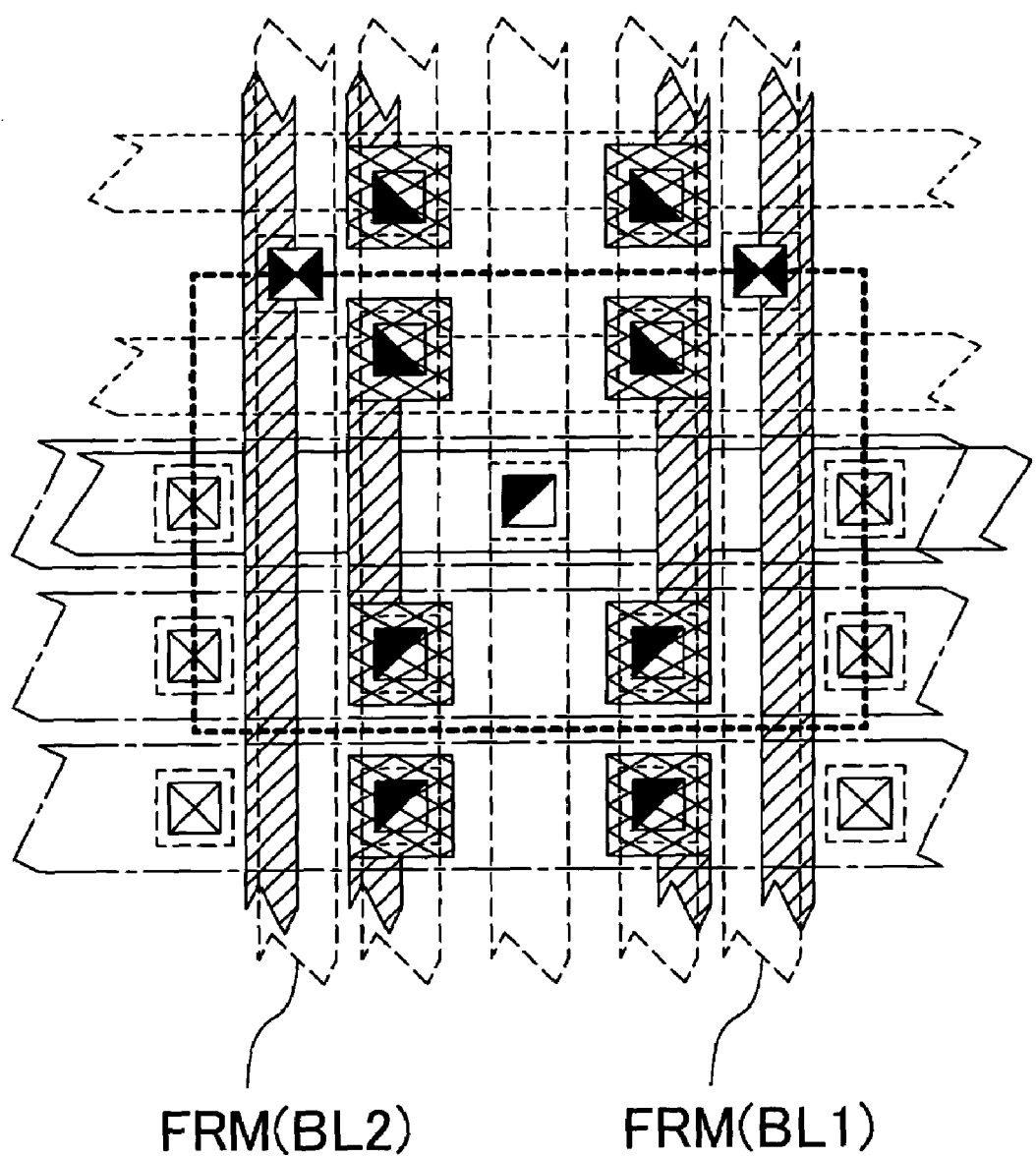
FIG. 20 is a diagram showing a fifth portion of the layout example of the ternary dynamic CAM cell using the vertical transistors.

Lastly, FIG. 20 will be described. In the figure, the pattern of the fourth metal layer for forming bit lines BL therein is added to the layout shown in FIG. 19. These patterns can be formed by use of a known photolithographic technique. It should be noted that the figures indicate each pattern name with its corresponding node (or line) name in parentheses next to it. Therefore, it will be easily understood that the T-DCAM cell is located at (or located in an area roughly defined by) the intersection points between the word line WL and the bit lines BL1 and BL2 or search lines SL1 and SL2 and between the match line ML and the bit lines BL1 and BL2 or search lines SL1 and SL2.

Figure 21:
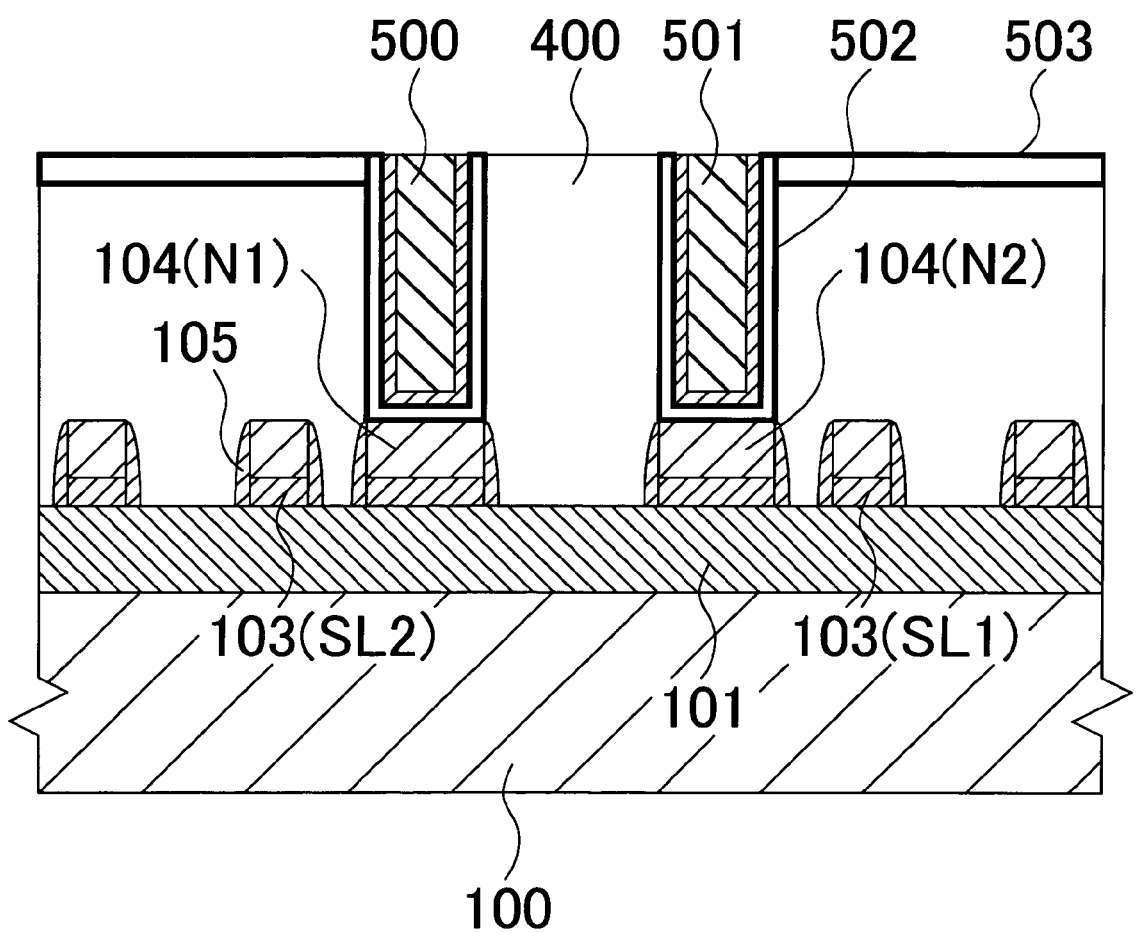
FIG. 21 is a cross-sectional view of the layout structure in FIG. 16 taken along line B–B'.

FIG. 21 is a schematic cross-sectional view of the structure shown in FIG. 16 taken along line B—B'. Reference numeral 100 denotes a p type semiconductor substrate; 101, an insulator buried within the p type semiconductor substrate for separating the device; 103, the gate oxide films of transistors formed on the substrate; 104, the gate electrodes of the transistors formed on the substrate; and 105, a sidewall made up of an insulation film provided on a transistor formed on the substrate. Further, reference numeral 400 denotes an interlayer insulation film. Still further, reference numeral 500 denotes the gate electrode of a vertical transistor; 501, the gate oxide film of the vertical transistor; 502, a very thin polysilicon layer made of an intrinsic semiconductor for forming therein a transistor channel and source electrode; and 503, the second polysilicon layer for forming the drain electrodes of vertical transistors.

Figure 22:
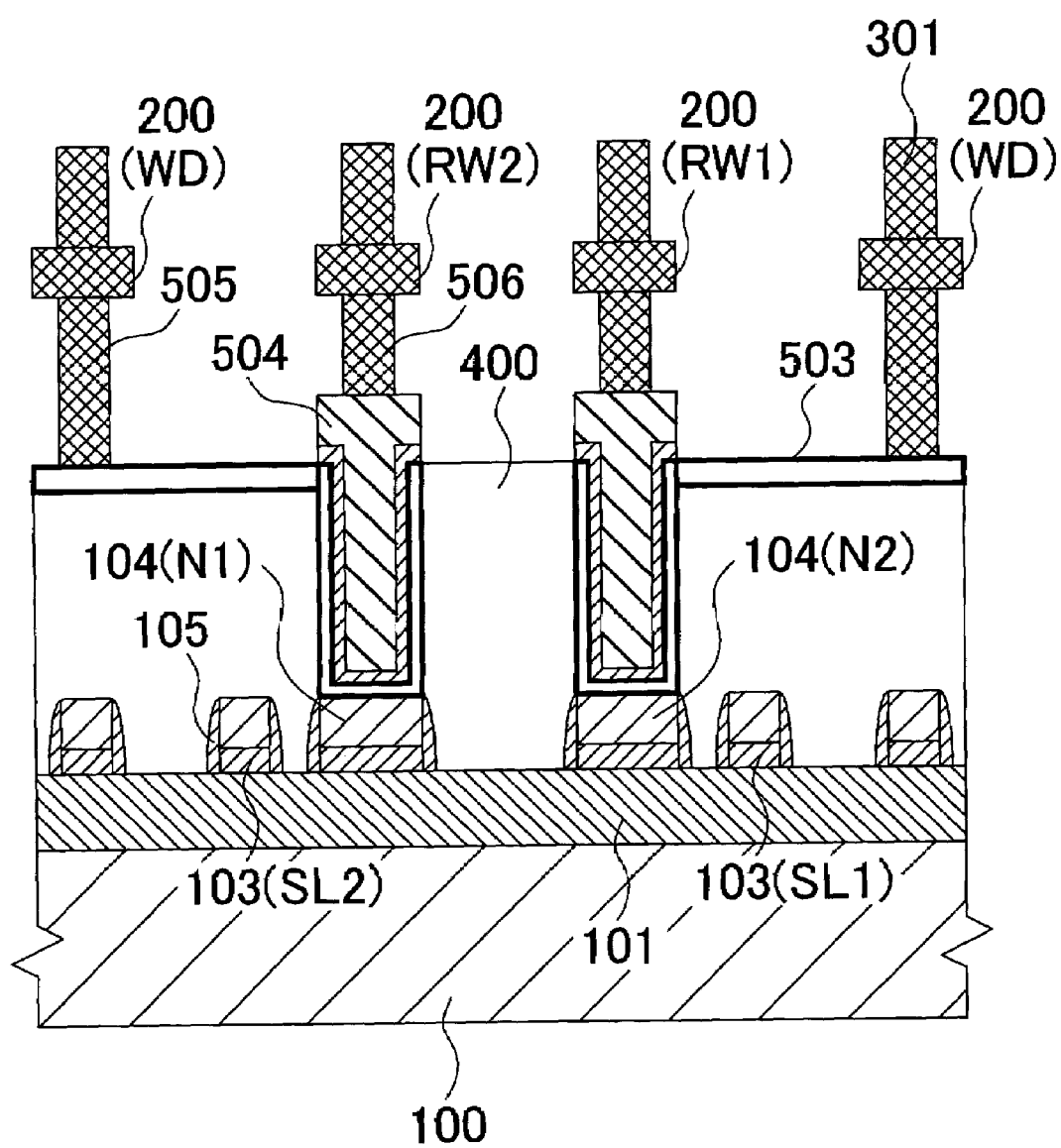
FIG. 22 is a cross-sectional view of the layout structure in FIG. 17 taken along line C–C'.

FIG. 22 is a schematic cross-sectional view of the structure shown in FIG. 17 taken along line C—C'. Reference numeral 200 denotes the first metal layer (of this embodiment) formed as a buffer layer for connecting the internal nodes. Further, reference numeral 301 denotes a first throughhole for connecting the first metal layer and the second metal layer. Still further, reference numeral 504 denotes the third polysilicon layer for forming a buffer layer therein for connecting the gate electrodes of vertical transistors and the first metal layer; 505, a second contact for connecting the second polysilicon layer and the first metal layer; and 506, a third contact for connecting the third polysilicon layer and the first metal layer. FIGS. 21 and 22 also indicate each layer name with its corresponding node (or line) name in parentheses next to it, as in FIGS. 16 and 17. For example, it will be easily understood from the node name of each gate electrode indicated by reference numeral 104 that the vertical transistors in the figure are the transistors T7 and T8 in the configuration shown in FIG. 1. Furthermore, it will also be easily understood that the current path between the source and drain of each vertical transistor is formed in a direction perpendicular to the semiconductor substrate surface.

The T-DCAM cell of the present embodiment employs vertical transistors as described above, thereby producing the following two effects. One is that the cell area can be reduced. Assume, for example, that the following four layout rules are applied to the layouts shown in FIGS. 16 to 20. First, the minimum value for the wiring width and the wiring interval of each layer is set to F (F: minimum feature size). Second, the patterns of each contact and each throughhole are square with a side dimension of F. Third, the optical alignment margin between each contact and the electrode under it is set to (0.5)*F. The fourth rule is such that the optical alignment margin for connection between each throughhole and each metal wiring layer is set to zero. Use of these four rules allows the ground potential VSS supply lines VG and the word lines WL to be disposed at pitches of 13*F. and 9*F., respectively, making it possible to produce a T-DCAM cell having a cell area of 117*F$^2$. This value is approximately one half of the cell area for the first embodiment. Therefore, a highly integrated T-CAM having a large capacity can be produced.

The other effect is that the retention characteristic is enhanced. The channels of the vertical transistors are formed of an intrinsic semiconductor having a film thickness of only a few nanometers, as described above, producing quantum confinement effect. Therefore, only a very small leakage current flows when the vertical transistors are off, making it possible to retain the charge at each node for a long period of time. As a result, it is possible to reduce the power consumption of the T-CAM in the refresh operation.

Third Embodiment

Figure 23:
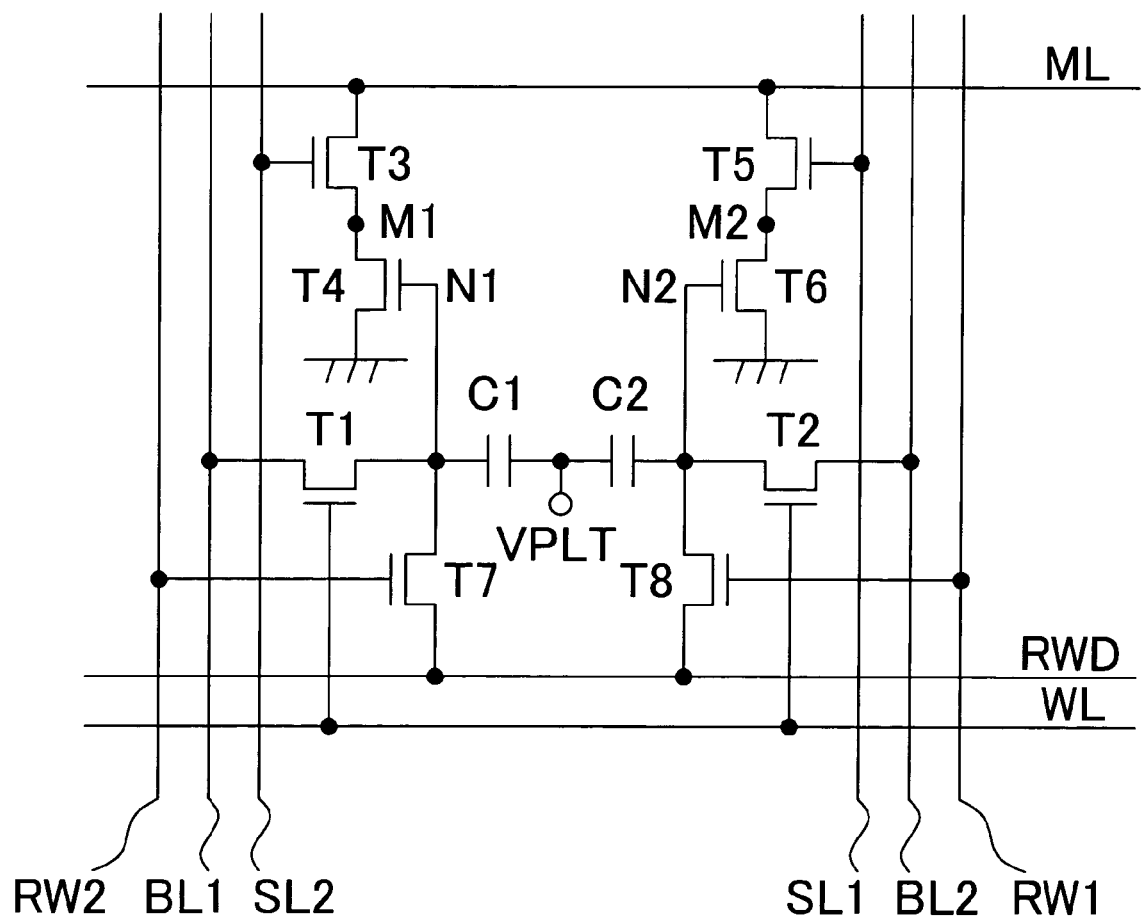
FIG. 23 is a diagram showing another configuration example of a ternary dynamic CAM cell made up of 8 transistors and 2 capacitors.

Description will be made below of another T-DCAM cell configuration example. FIG. 23 shows a cell configuration according to a third embodiment of the present invention. This configuration is characterized in that capacitors C1 and C2 are added to the storage nodes N1 and N2, respectively, in the cell configuration shown in FIG. 1. When all transistors are formed on the silicon substrate as described in connection with the first embodiment, the capacitance values of the capacitors C1 and C2 are set large enough that a desired retention time can be obtained, considering (the stored data retention time and) the leakage currents of the transistors T1, T2, T7, and T8. Therefore, it is possible to reduce the power consumption of the T-CAM in the refresh operation. It should be noted that as is easily understood from the above description, the capacitors C1 and C2 can also be added to the cell structure using vertical transistors described in connection with the second embodiment. In this case, the retention characteristic can be further enhanced.

Fourth Embodiment

Figure 24:
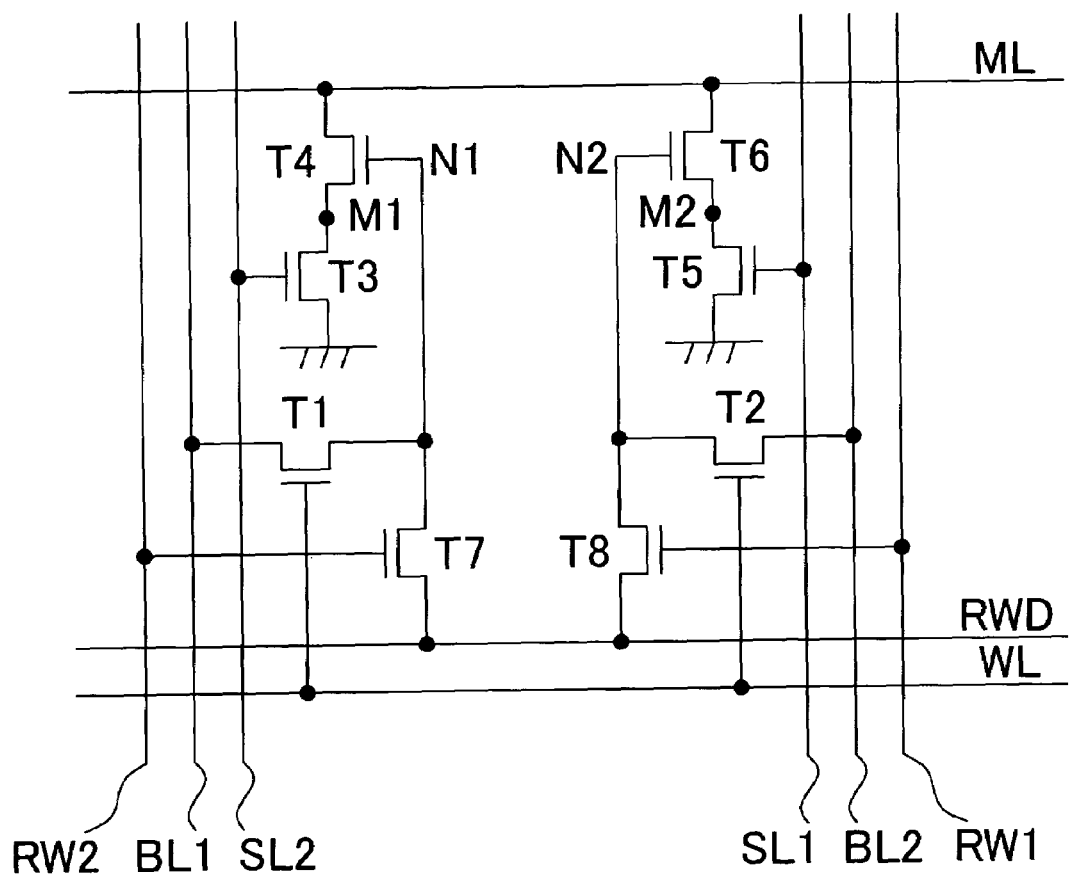
FIG. 24 is a diagram showing another configuration example of a ternary dynamic CAM cell made up of 8 transistors.

Description will be made below of still another T-DCAM cell configuration example. FIG. 24 shows a cell configuration according to a fourth embodiment of the present invention. This configuration is characterized in that the positions of the transistors T3 and T4 are switched as well as those of the transistors T5 and T6. Specifically, the transistors T4 and T3 are connected between the match line ML and the grounded electrode in that order, and the T6 and T5 are also connected between these lines in that order. With this arrangement, in the search operation and the read operation, the intermediate node M1 or M2 connected to the match line ML can be precharged to the same voltage as that of the match line ML. Therefore, in the search operation and the read operation, charge-sharing between the match line ML and the intermediate nodes M1 and M2 can be avoided, making it possible to properly discriminate the compare signal generated on the match line ML. It should be noted that the above technique of the present invention can be applied to the cell configuration shown in FIG. 23, producing the same effect.

Fifth Embodiment

Figure 25:
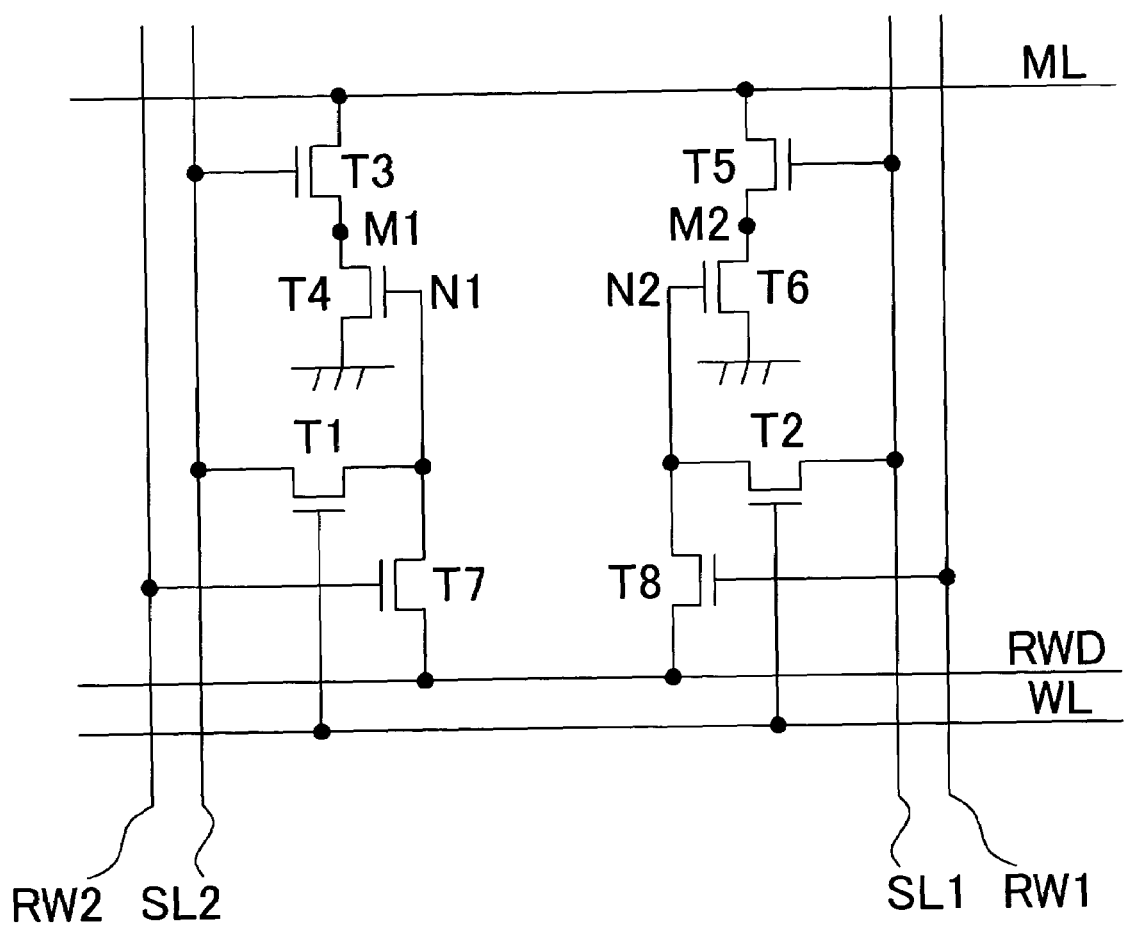
FIG. 25 is a diagram showing still another configuration example of a ternary dynamic CAM cell made up of 8 transistors.

Description will be made below of still another T-DCAM cell configuration example. FIG. 25 shows a cell configuration according to a fifth embodiment of the present invention. This configuration is characterized in that a single common line is used as both a bit line and a search line. Specifically, the search line SL2 is connected to the drain of the transistor T1 to act as the bit line BL1, while the search line SL1 is connected to the drain of the transistor T2 to act as the bit line BL2. In this configuration, when data 1 or data 0 is entered, these search lines are driven to opposite polarities. For example, when data 1 is entered in the write operation, the search line SL2 is driven to the power supply voltage VDD and the search line SL1 is driven to the ground potential VSS. In the search operation, on the other hand, the search line SL2 is driven to the ground potential VSS and the search line SL1 is driven to the power supply voltage VDD. It should be noted that the match lines in the unselected rows are driven to the ground potential VSS to prevent charging/discharging (thereof) in the write operation.

The above configuration and operation make it possible to reduce the number of lines and hence reduce the layout area. Furthermore, the number of wiring layers can be reduced, resulting a reduction in the number of masks to be employed, which leads to reduced cost per bit. It should be noted that the above technique of the present invention can be applied to the cell configurations shown in FIGS. 23 and 24, producing the same effect.

Sixth Embodiment

Figure 26:
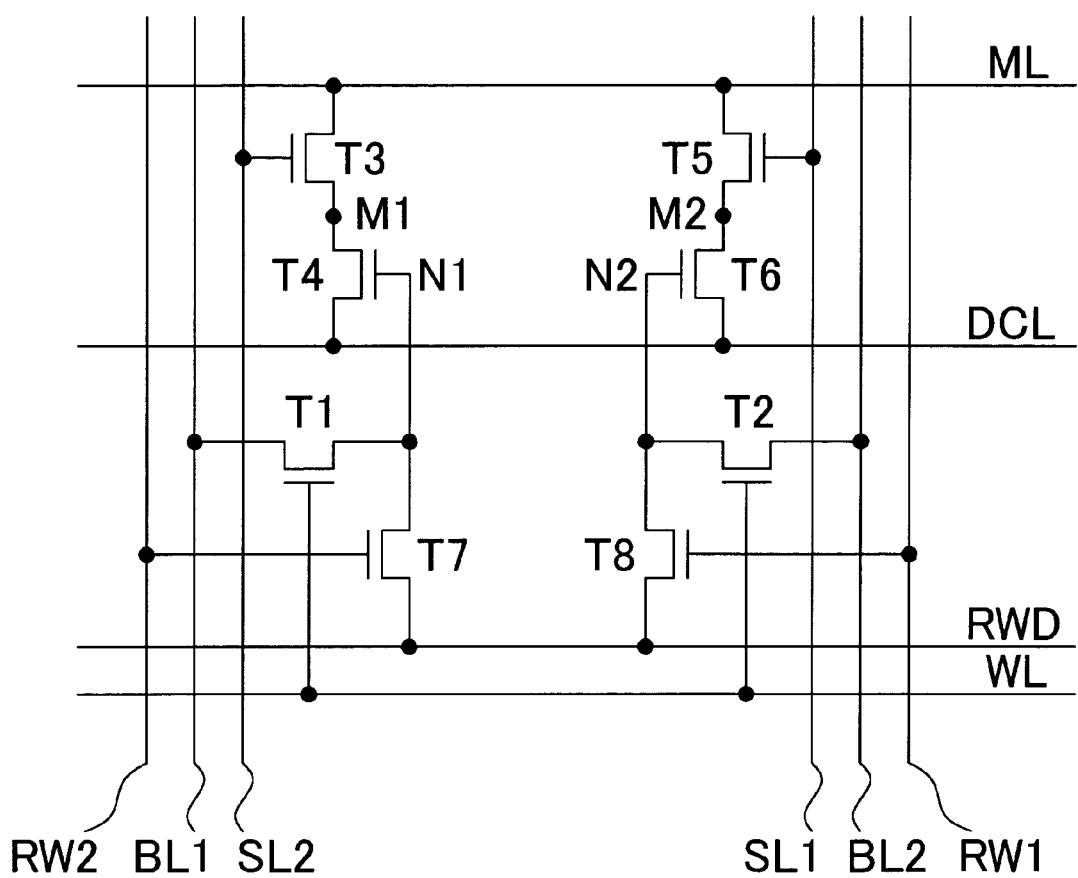
FIG. 26 is a diagram showing yet another configuration example of a ternary dynamic CAM cell made up of 8 transistors.

Lastly, description will be made below of still another T-DCAM cell configuration example. FIG. 26 shows a cell configuration according to a sixth embodiment of the present invention. This configuration is characterized in that the transistors T4 and T6 in the cell configuration shown in FIG. 1 are connected to a discharge line DCL as shown in FIG. 2. This arrangement allows reducing the discharge current, thereby providing a T-CAM having reduced power consumption. It should be noted that the above technique of the present invention can be applied to the cell configurations shown in FIGS. 23, 24, and 25, producing the same effect.

The above descriptions explain T-DCAM cells having the rewrite transistors T7 and T8 therein. However, the present invention is not limited to the configurations and operations described above, and various variations may be made thereto. For example, according to the above embodiments, in the search operation and the refresh operation, the match line is precharged to a high voltage to generate the compare signal VSIG.

However, the precharge voltage is not limited to high voltages. The T-DCAM cells of the present invention can be applied to an operation in which the match line is precharged to the ground potential VSS as described in Japanese Laid-Open Patent Publication No. 10-27481 (1998). In this case, the speed of the search operation can be further increased.

Further, in the above descriptions, the present invention is described as applied to off-chip T-CAM arrays. However, the present invention can be applied to other types of CAMs (T-DCAM arrays). For example, the present invention may be applied to an on-chip T-CAM or a binary CAM for searching for binary data. In either case, the same effect as that of the above embodiments can be obtained.

Thus, the present invention is applied to a T-CAM array having dynamic CAM cells and can provide a high-speed search operation and reduced array area.

What is claimed is:

1. A semiconductor device, comprising:
a match line extending in a first direction;
a first search line and a second search line extending in a second direction;
a rewrite data line extending in said first direction;
a comparison signal detecting circuit connected to said match line; and
a plurality of memory cells each including a pair of first and second data retaining units,
said first data retaining unit including a first transistor, a first storage node, and a first rewrite transistor,
said second data retaining unit including a second transistor, a second storage node, and a second rewrite transistor;
wherein:
said first and second storage nodes each hold written entry data;
said first transistor is connected to said first storage node and transfers said data held by said first storage node to said match line according to signal voltages of said search lines;
said second transistor is connected to said second storage node and transfers said data held by said second storage node to said match line according to said signal voltages of said search lines;
said first rewrite transistor is disposed between said first storage node and said rewrite data line; and
said second rewrite transistor is disposed between said second storage node and said rewrite data line;
wherein in a search operation, said semiconductor device performs steps of:
generating, on said match line, a signal corresponding to a result of comparison between search key data entered from said search lines and said data held by said first and second data retaining units; and
discriminating (detecting) said signal by use of said comparison signal detecting circuit; and
wherein in a refresh operation on said data held by said first and second storage nodes, said semiconductor device performs steps of:
sequentially activating said first and second search lines to generate, on said match line, a signal corresponding to said data held by said first and second data retaining units;
discriminating said signal by use of said comparison signal detecting circuit;
transferring said discriminated data to said rewrite data line; and
writing said transferred data to said storage nodes through said rewrite transistors.

2. The semiconductor device as claimed in claim 1, wherein one end of said first storage node and one end of said second storage node are connected to said rewrite data line through a first vertical field effect transistor and a second vertical field effect transistor, respectively, each transistor having a source-drain current path perpendicular to a main surface of a semiconductor substrate.

3. The semiconductor device as claimed in claim 1, wherein said storage nodes are in an electrically floating state when said data held by said storage nodes is accessed according to signals from said search lines.

4. A semiconductor devices, comprising:
a match line extending in a first direction;
a first search line and a second search line extending in a second direction;

a first bit line disposed such that it forms a pair with said second search line;

a second bit line disposed such that it forms a pair with said first search line;

a first rewrite column select line disposed such that it forms a pair with said first bit line;

a second rewrite column select line disposed such that it forms a pair with said second bit line;

a word line and a rewrite data line both running in a direction of said match line;

a comparison signal detecting circuit connected to said match line; and a plurality of memory cells each including a pair of first and second data retaining units together functioning as a data storage unit, said first data retaining unit including a first transistor, a first data retaining transistor, a first write transistor, and a first rewrite transistor, said second data retaining unit including a second transistor, a second data retaining transistor, a second write transistor, and a second rewrite transistor;

wherein:

said first and second data retaining transistors each hold written entry data, one end of each of said first and second data retaining transistors being connected to a grounded line;

said first transistor is connected to one end of said first data retaining transistor and transfers said data held by said first data retaining transistor to said match line according to signal voltages of said search lines;

said second transistor is connected to one end of said second data retaining transistor and transfers said data held by said second data retaining transistor to said match line according to said signal voltages of said search lines;

said first rewrite transistor is disposed between said first data retaining transistor and said rewrite data line;

said second rewrite transistor is disposed between said second data retaining transistor and said rewrite data line;

said first write transistor is connected between said first data retaining transistor and said first bit line; and said second write transistor is connected between said second data retaining transistor and said second bit line;

wherein in a search operation for data stored in each memory cell, said semiconductor device performs steps of:

entering search key data from said first and second search lines to compare said search key data with said entry data held by said first and second data retaining transistors; and outputting each comparison result to said match line as a signal voltage; and wherein in a refresh operation on said data held by said data retaining transistors, said semiconductor device performs steps of:

sequentially activating said first and second search lines to read out said data to said match line;

discriminating said read-out data by use of said comparison signal detecting circuit; and activating said first and second rewrite column select lines to rewrite said discriminated data to said data retaining transistors through said rewrite data line.

5. The semiconductor device as claimed in claim 4, wherein said first and second write transistors are vertical field effect transistors each having a source-drain current path perpendicular to a main surface of a semiconductor substrate.

6. The semiconductor device as claimed in claim 4, wherein said first and second write transistors and said first and second rewrite transistors are vertical field effect transistors each having a source-drain current path perpendicular to a main surface of a semiconductor substrate.

7. The semiconductor device as claimed in claim 4, wherein:

gate terminals of said first data retaining transistor and said second data retaining transistor have a first storage node and a second storage node, respectively, for holding written entry data; and said storage nodes are in an electrically floating state when said data held by said storage nodes is accessed according to signals from said search lines.

8. The semiconductor device as claimed in claim 4, wherein: one end of a first capacitor is connected to said first storage node; one end of a second capacitor is connected to said second storage node; and the other end of said first capacitor is connected to the other end of said second capacitor.

9. The semiconductor device as claimed in claim 4, wherein: a single common line is used as both said first bit line and said second search line; and another single common line is used as both said second bit line and said first search line.

10. A semiconductor device, comprising:

a match line extending in a first direction;

a first search line and a second search line extending in a second direction;

a rewrite data line extending in said first direction;

a comparison signal detecting circuit connected to said match line; and a plurality of memory cells each including a pair of first and second data retaining units together functioning as a data storage unit, said first data retaining unit including a first transistor, a first data retaining transistor, a first write transistor, and a first rewrite transistor, said second data retaining unit including a second transistor, a second data retaining transistor, a second write transistor, and a second rewrite transistor;

wherein:

said first and second data retaining transistors each hold written entry data;

said first transistor transfers said data held by said first data retaining transistor to said match line according to signal voltages of said search lines;

said second transistor transfers said data held by said second data retaining transistor to said match line according to said signal voltages of said search lines;

said first rewrite transistor is disposed between said first data retaining transistor and said rewrite data line;

said second rewrite transistor is disposed between said second data retaining transistor and said rewrite data line;

said first write transistor is connected between said first data retaining transistor and said first bit line; and said second write transistor is connected between said second data retaining transistor and said second bit line; and wherein said comparison signal detecting circuit generates, on said match line, a signal corresponding to a result of comparison between search key data entered from said first and second search lines and said entry data written into said first and second data retaining transistors, and discriminates said signal.

11. The semiconductor device as claimed in claim 10, wherein: one end of said first data retaining transistor is connected to said first transistor; one end of said second data retaining transistor is connected to said second transistor; and the other end of each data retaining transistor is connected to a grounded line.

12. The semiconductor device as claimed in claim 10, wherein: one end of each of said first and second data retaining transistors is connected to said match line; the other end of said first data retaining transistor is connected to said first transistor; the other end of said second data retaining transistor is connected to said second transistor; and one end of each of said first and second transistors is connected to a grounded line.

13. The semiconductor device as claimed in claim 10, wherein: one end of said first data retaining transistor is connected to said first transistor; one end of said second data retaining transistor is connected to said second transistor; and the other end of each data retaining transistor is connected to a discharge line disposed in said direction of said match line.

14. The semiconductor device as claimed in claim 10, wherein said first and second write transistors are vertical field effect transistors each having a source-drain current path perpendicular to a main surface of a semiconductor substrate.

15. The semiconductor device as claimed in claim 10, wherein said first and second write transistors and said first and second rewrite transistors are vertical field effect transistors each having a source-drain current path perpendicular to a main surface of a semiconductor substrate.

* * * * *